(12) United States Patent
Lee

(10) Patent No.: US 11,424,248 B2
(45) Date of Patent: Aug. 23, 2022

(54) BITLINE STRUCTURE FOR THREE-DIMENSIONAL INTEGRATED CIRCUIT AND METHOD OF FORMING THE SAME

(71) Applicant: Sang-Yun Lee, Hillsboro, OR (US)

(72) Inventor: Sang-Yun Lee, Hillsboro, OR (US)

(73) Assignee: BeSang Inc., Hillsboro, OR (US)

( * ) Notice: Subject to any disclaimer, the term of this patent is extended or adjusted under 35 U.S.C. 154(b) by 6 days.

(21) Appl. No.: 17/032,944

(22) Filed: Sep. 25, 2020

(65) Prior Publication Data

US 2022/0102357 A1    Mar. 31, 2022

(51) Int. Cl.
*H01L 27/108* (2006.01)
*H01L 29/66* (2006.01)
*H01L 29/78* (2006.01)

(52) U.S. Cl.
CPC .. *H01L 27/10885* (2013.01); *H01L 27/10814* (2013.01); *H01L 27/10855* (2013.01); *H01L 27/10873* (2013.01); *H01L 27/10897* (2013.01); *H01L 29/66666* (2013.01); *H01L 29/7827* (2013.01)

(58) Field of Classification Search
None
See application file for complete search history.

(56) References Cited

U.S. PATENT DOCUMENTS

| | | | |
|---|---|---|---|
| 2009/0325343 A1* | 12/2009 | Lee | H01L 24/29 438/107 |
| 2010/0038743 A1* | 2/2010 | Lee | H01L 27/0688 257/499 |
| 2010/0190334 A1* | 7/2010 | Lee | H01L 24/24 438/637 |
| 2011/0053332 A1* | 3/2011 | Lee | H01L 21/2007 438/381 |
| 2011/0291234 A1* | 12/2011 | Lee | H01L 27/10808 257/532 |
| 2012/0003808 A1* | 1/2012 | Lee | H01L 27/11514 438/381 |

* cited by examiner

*Primary Examiner* — Steven M Christopher

(57) ABSTRACT

The invention involves a method of manufacturing a bonded semiconductor structure, comprising providing a support substrate which carries a transistor, and providing an interconnect region earned by the support substrate. The interconnect region includes a first multiple bypass bitline having an upper bypass interconnect and upper bypass via. The method includes providing a first conductive bonding layer carried by the interconnect region, wherein the first conductive bonding layer is connected to the upper bypass interconnect through the upper bypass via, and providing a vertical transistor carried by the first conductive bonding layer, the vertical transistor being in communication with the transistor through the interconnect region. The first multiple bypass bitline reduces the impedance experienced by the vertical transistor.

24 Claims, 17 Drawing Sheets

FIG. 23
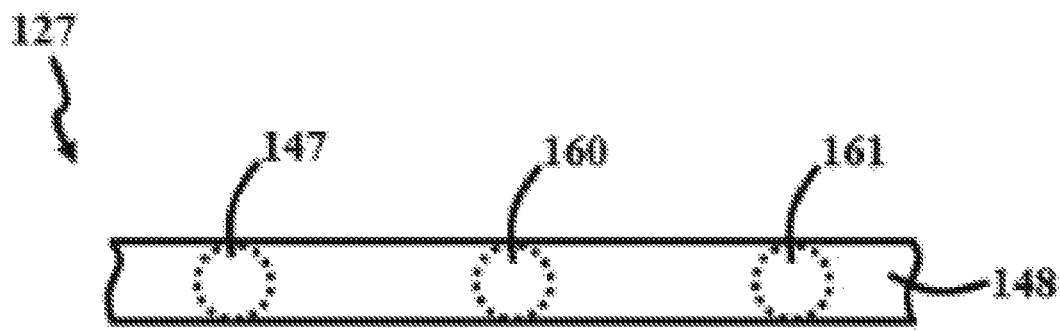
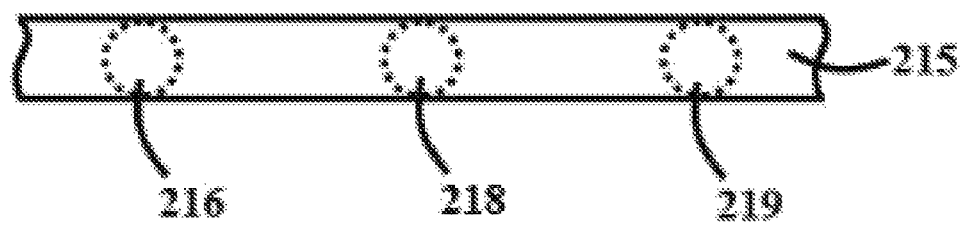
FIG. 24
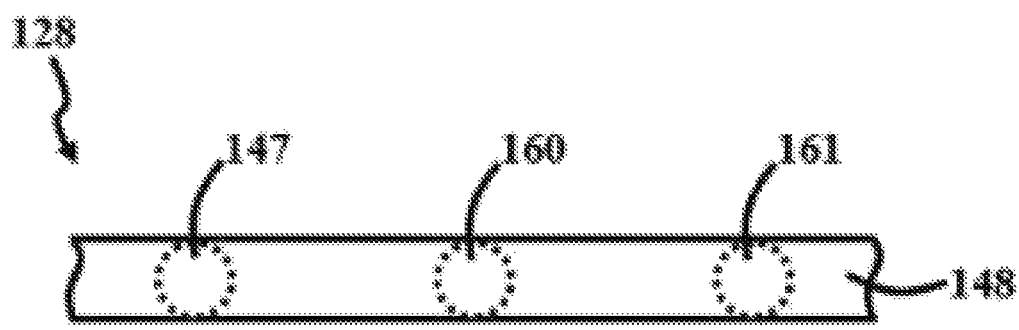
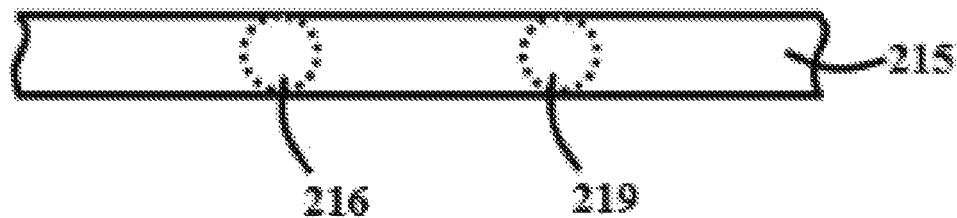

BITLINE STRUCTURE FOR THREE-DIMENSIONAL INTEGRATED CIRCUIT AND METHOD OF FORMING THE SAME

BACKGROUND OF THE INVENTION

Field of the Invention

This invention relates generally to semiconductor circuitry.

Description of the Related Art

Advances in semiconductor manufacturing technology have provided computer systems with integrated circuits that include many millions or billions of active and passive electronic devices, along with the interconnects to provide the desired circuit connections. A typical computer system includes a computer chip, with processor and control circuits, and an external memory chip. As is well-known, most integrated circuits include laterally oriented active and passive electronic devices that are carried on a single major surface of a substrate. The current flow through laterally oriented devices is generally parallel to the single major surface of the substrate. Active devices typically include transistors and passive devices typically include resistors, capacitors, and inductors. However, these laterally oriented devices consume significant amounts of chip area. Sometimes laterally oriented devices are referred to as planar or horizontal devices. Examples of laterally oriented devices can be found in U.S. Pat. No. 6,600,173 to Tiwari, U.S. Pat. No. 6,222,251 to Holloway and U.S. Pat. No. 6,331,468 to Aronowitz.

Vertically oriented devices extend in a direction that is generally perpendicular to the single major surface of the substrate. The current flow through vertically oriented devices is generally perpendicular to the single major surface of the substrate. Hence, the current flow through a vertically oriented semiconductor device is generally perpendicular to the current flow through a horizontally oriented semiconductor device. Examples of vertically oriented semiconductor device can be found in U.S. Pat. No. 5,106,775 to Kaga, U.S. Pat. No. 6,229,161 to Nemati, U.S. Pat. No. 7,078,739 to Nemati. It should be noted that U.S. Pat. No. 5,554,870 to Fitch, U.S. Pat. No. 6,229,161 to Nemati and U.S. Pat. No. 7,078,739 to Nemati disclose the formation of both horizontal and vertical semiconductor devices on a single major surface of a substrate.

It is desirable to provide computer chips that can operate faster so that they can process more data in a given amount of time. The speed of operation of a computer chip is typically measured in the number of instructions in a given amount of time if can perform. Computer chips can be made to process more data in a given amount of time in several ways. For example, they can be made fester by decreasing the time it takes to perform certain tasks, such as storing and retrieving information to and from the memory chip. The time needed to store and retrieve information to and from the memory chip can be decreased by embedding the memory devices included therein with the computer chip. This can be done by positioning the memory devices on the same surface as the other devices carried by the substrate.

However, there are several problems with doing this. One problem is that the masks used to fabricate the memory devices are generally not compatible with the masks used to fabricate the other devices on the computer chip. Hence, it is more complex and expensive to fabricate a computer chip with memory embedded in this way. Another problem is that memory devices tend to be large and occupy a significant amount of area. Hence, if most of the area on the computer chip is occupied by memory devices, then there is less area for the other devices. Further, the yield of the computer chips fabricated in a run decreases as their area increases, which increases the overall cost.

Instead of embedding the memory devices on the same surface as the other devices, the memory chip can be bonded to the computer chip to form a stack, as in a 3-D package or a 3-D integrated circuit (IC). Conventional 3-D packages and 3-D ICs both include a substrate with a memory circuit bonded to it by a bonding region positioned therebetween. The memory chip typically includes lateral memory devices which are prefabricated before the bonding takes place. In both the 3-D package and 3-D ICs, the memory and computer chips include large bonding pads coupled to their respective circuits. However, in the 3-D package, the bonding pads are connected together using wire bonds so that the memory and computer chips can communicate with each other. In the 3-D IC, the bonding pads are connected together using high pitch conductive interconnects which extend therebetween. Examples of 3-D ICs are disclosed in U.S. Pat. Nos. 5,087,585, 5,308,782, 5,355,022, 5,915,167, 5,998,808 and 6,943,067.

There are several problems, however, with using 3-D packages and 3-D ICs. One problem is that the use of wire bonds increases the access time between the computer and memory chips because the impedance of wire bonds and large contact pads is high. The contact pads are large in 3-D packages to make it easier to attach the wire bonds thereto. Similarly, the contact pads in 3-D ICs have correspondingly large capacitances which also increase the access time between the processor and memory circuits. The contact pads are large in 3-D ICs to make the alignment between the computer and memory chips easier. These chips need to be properly aligned with each other and the interconnects because the memory devices carried by the memory chip and the electronic devices carried by the computer chip are prefabricated before the bonding takes place.

Another problem with using 3-D packages and 3-D ICs is cost. The use of wire bonds is expensive because it is difficult to attach them between the processor and memory circuits and requires expensive equipment. Further, it requires expensive equipment to align the various devices in the 3-D IC. The bonding and alignment is made even more difficult and expensive because of the trend to scale devices to smaller dimensions. It is also very difficult to fabricate high pitch conductive interconnects.

Another problem is that the interconnects of 3-D ICs tend to have a high impedance. The impedance can be in the form of a parasitic impedance, such as a parasitic capacitance, resistance, and/or inductance. The parasitic impedance can be a bitline-to-bitline capacitance, bitline-to-bitline resistance, or a bitline-to-bitline inductance, for example, or a combination thereof. The high impedance is generally undesirable because it slows the operation of the 3D-IC The operation of the 3D-IC slows down in response to having a high impedance because it takes longer for signals to travel therethrough.

Accordingly, it is highly desirable to provide a new electronic device, and a method of forming the same using wafer bonding, which is cost effective and reliable, and can be bonded at low temperature. It is also desirable to provide 3D-ICs that have a lower impedance so they can operate faster. In this way, the 3D-IC can process more data in a given amount of time.

BRIEF SUMMARY OF THE INVENTION

The present invention is directed to a method of forming a bonded semiconductor structure. The novel features of the invention are set forth with particularity in the appended claims. The invention will be best understood from the following description when read in conjunction with the accompanying drawings.

BRIEF DESCRIPTION OF THE DRAWINGS

FIG. 23 is a top view of an embodiment of a layout which includes aligned bypass vias.

FIG. 24 is a top view of an embodiment of a layout which includes staggered bypass vias.

DETAILED DESCRIPTION OF THE INVENTION

Figure 1:
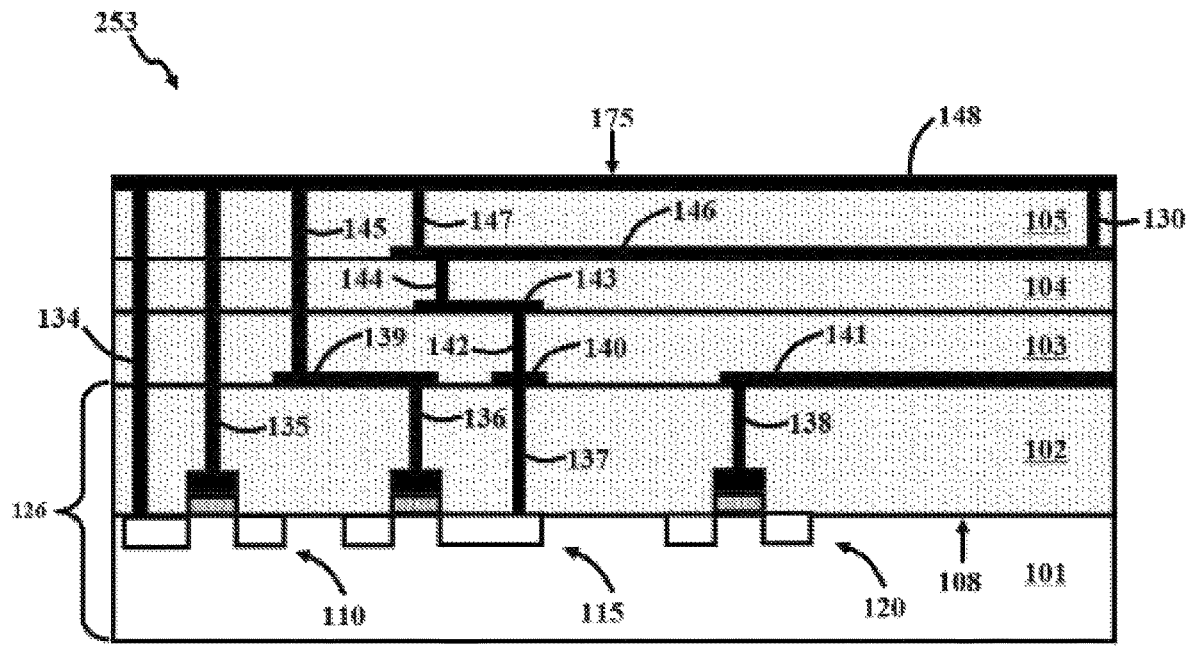
FIG. 1 is a sectional view of one embodiment of an acceptor wafer, wherein two vias extend between a conductive bonding layer and a first interconnect.
Figure 2:
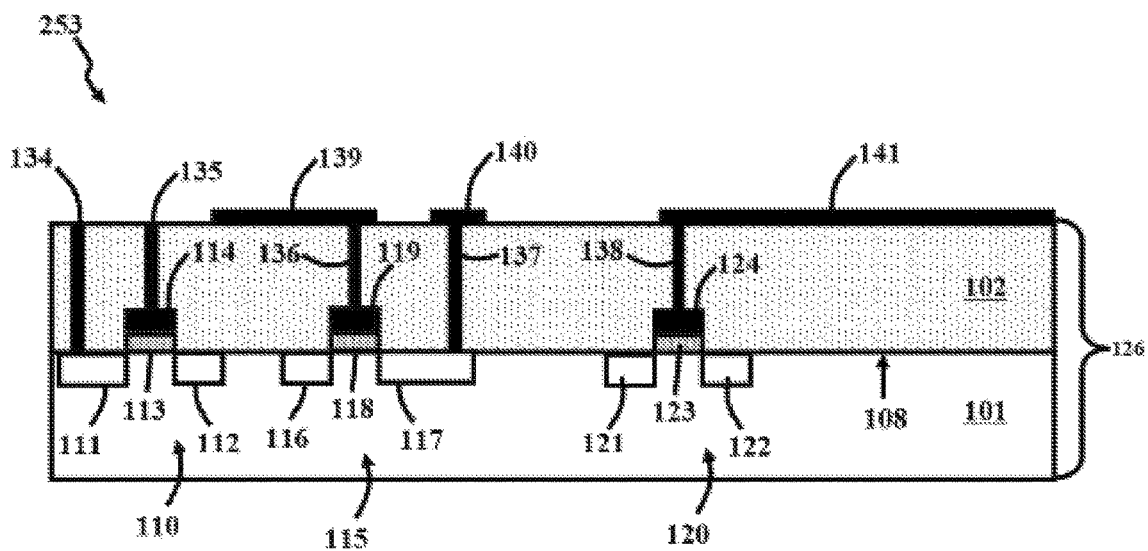
FIG. 2 is a sectional view of a substrate region of the acceptor wafer of FIG. 1.

FIG. 1 is a sectional view of one embodiment of an acceptor wafer 253, wherein two bypass vias 147 and 130 extend between a conductive bonding layer 148 and a bypass interconnect 146. FIG. 2 shows a substrate region 126 of the acceptor wafer 253 of FIG. 1. As discussed in more detail below, the acceptor wafer 253 is used to form a bonded semiconductor structure. The acceptor wafer 253 includes interconnects and vias which are connected together in a way to reduce the impedance thereof. In this way, the access time between various portions of the acceptor wafer 253 is reduced. Hence, the acceptor wafer 253 can operate foster and it can process more data in a given amount of time.

Some of the steps of manufacturing the acceptor wafer 253 include steps of providing a structure, such as a substrate, interconnect region, etc., and it should be noted that the acceptor wafer 253 can be provided in many different ways. For example, in some situations, a user provides the acceptor wafer 253 by manufacturing 2 and, in other situations, the user provides the acceptor wafer 253 by acquiring it, such as from a manufacturer. Some of the steps include steps of forming a structure, such as a substrate, interconnect region, conductive line, transistor, etc., and it should be noted that the structure can be formed in many different ways. For example, in some situations, the acceptor wafer 253 is formed by the user and in other situations, the acceptor wafer 253 is formed by someone else and then provided to the user. The structures can be formed in many different ways, such as by growth, deposition, etc. Steps in forming the structures can include steps of photolithography and etching, as well as some of the steps mentioned below. It should be noted that, in general, an interconnect region generally includes a dielectric region and a conductive line, such as an interconnect and or via.

In this embodiment, a support substrate 101 is provided, wherein support substrate 101 includes a substrate body region. The support substrate 101 can include many different types of material. In this embodiment, the support substrate 101 includes crystalline silicon. However, in some embodiments, the support substrate 101 includes other semiconductor materials, such as silicon-germanium, gallium arsenide, gallium nitride and silicon carbide, etc. The support substrate 101 can have many different layer structures. In this embodiment, the support substrate 101 is a single layer of semiconductor material. In other embodiments, support substrate can have a silicon-on-sapphire (SOS) layer structure, silicon-germanium layer structure, silicon-on-insulator (SOI) layer structure, etc.

In this embodiment, the acceptor wafer 253 includes horizontal transistors 110, 115, and 120, wherein the horizontal transistors 110, 115, and 120 are earned by the support substrate 101. The formation of the horizontal transistors 110, 115, and 120 often involves one or mere processing steps, such as photolithography, etching, annealing, implantation, deposition, etc. The horizontal transistors 110, 115, and 120 can be of many different types of transistors, such as NMOS transistors or PMOS transistors. It should be noted that the horizontal transistors 110, 115 and 120 are horizontal transistors because the current flow therethrough is substantially perpendicular to a surface 108 of the support substrate 100. Examples of horizontal transistors include FinFETs, Recess-Channel-Array-Transistors (RACT), nano wires, among ethers.

It should be noted that the support substrate 101 and horizontal transistors 110, 115 and 120 can be provided in many different ways. For example, in some embodiments, the support substrate 101 and horizontal transistors 110, 115, and 120 are formed by the end user and, in other embodiments, the support substrate 101 and horizontal transistors 110, 115 and 120 are provided to the end user already formed.

In this embodiment, and as shown in FIG. 2, the horizontal transistor 110 includes a source 111 and drain 112, which are portions of the support substrate 101. Further, the transistor 110 includes a control dielectric 113 positioned on the surface 108 of the support substrate 101, and a control terminal 114 positioned on the control dielectric 113. In operation, the control terminal 114 controls the conductivity of a region of the support substrate 101 which extends between the source 111 and drain 112.

In this embodiment, the horizontal transistor 115 includes a source lid and drain 11, which are portions of the support substrate 101. Further, the horizontal transistor 117 includes a control dielectric 118 positioned on the surface 108 of the support substrate 101, and a control terminal 119 positioned on control dielectric 118. In operation, control terminal 119 controls the conductivity of a region of the support substrate 101 which extends between the source 116 and drain 117.

In this embodiment, the horizontal transistor 120 includes a source 121 and drain 122, which are portions of the support substrate 101. Further, the transistor 120 includes a control dielectric 123 positioned on the surface 108 of the support substrate 101, and a control terminal 124 positioned on the control dielectric 123. In operation, the control terminal 124 controls the conductivity of a region of the support substrate 101, which extends between the source 121 and drain 122.

In some embodiments, the horizontal transistors 110, 115, and 120 can be isolated from each other. The horizontal transistors 110, 115, and 120 can be isolated from each other in many different ways. For example, an isolation region can extend through the support substrate 101 between the horizontal transistors 110 and 115. Further, an isolation region can extend through the support substrate 101 between the horizontal transistors 115 and 120. The corresponding isolation regions restrict the flow of current through the support substrate 101 between the horizontal transistors 110, 115, and 120. In this way, the horizontal transistors 110, 115, and 120 are isolated from each other. The isolation regions can be formed in many different ways. In one embodiment, the isolation regions are formed by forming corresponding trenches through the support substrate 101, and filling the trenches with a dielectric material using a high density plasma (HDM) oxide technique. More information regarding isolation regions can be found in the references cited above by the same inventor.

In FIGS. 1 and 2, a dielectric region 102 is carried by the support substrate 101. It should be noted that the dielectric region 102 can be formed by the end user on the support substrate 101, or it can be provided to the end user already formed on the support substrate 101. In this embodiment, the dielectric region 102 extends over and covers the horizontal transistors 110, 115, and 120. The dielectric region 102 forms a growth interface proximate to the surface 108, wherein the growth interface is a dielectric-to-semiconductor growth interface because it is established between the support substrate 101 and the dielectric region 102, which includes semiconductor material proximate to the surface 108. The dielectric region 102 can include many different types of dielectric materials, such as silicon dioxide, silicon nitride, PSG (PhosphoSilicate Glass), BPSG (BoroPhosphoSilicate Glass), USG (Undoped Silicate Glass) and PE-TEOS (Plasma Enhanced-TetraEthylOrthoSilicate Glass).

In this embodiment, the acceptor wafer 253 includes one or more conductive lines which extend through the dielectric region 102. The conductive lines can be of many different types, such as a via and interconnect, wherein a via extends perpendicular to the surface 108 and an interconnect extends parallel to the surface 108. The conductive lines are typically connected to horizontal transistors 110, 115, and or 120 to allow them to communicate with each other, as well as one or more vertical transistors, which will be discussed in more detail below.

The vias included herein can be formed in many different ways. The formation of the vias typically involves one or more etching steps to form an opening through a dielectric material region. The formation of the vias typically includes one or more depositions steps to deposit the material of the via through the opening formed through the dielectric material region. Many different types of etching, such as wet and dry etching, can be used to form the openings. The wet etching typically involves using anisotropic etching, so that the opening can be formed with a desired pitch.

The material of the conductive lines can be of many different types, such as aluminum and copper and refractory metal. It should be noted that the conductive lines are typically connected to a semiconductor material through a contact metal, which forms an ohmic contact. For example, the conductive lines are typically connected to a corresponding source or drain of a transistor through an ohmic contact. However, the contact metals are not shown herein for simplicity. The contact metals can be of many different types, such as tungsten (W), titanium (Ti), molybdenum (Mo), tantalum (Ta), titanium nitride (TiN), tantalum nitride (TaN), zirconium nitride (ZrN), tungsten nitride, and alloys thereof. It should be noted that the alloys can include refractory metal allows.

In this embodiment and as shown in FIG. 2, a via 134 is connected to the source 111 and extends upwardly therefrom. A via 135 is connected to the control terminal 114 and extends upwardly therefrom. In this embodiment, a via 136 is connected to the control terminal 119 and extends upwardly therefrom. A via 137 is connected to the drain 117 and extends upwardly therefrom. In this embodiment, a via 138 is connected to the control terminal 124 and extends upwardly therefrom. It should be noted that the vias 134, 135, 136, and 138 extend through the dielectric region 102.

In this embodiment, an interconnect 139 is connected to the via 136, an interconnect 140 is connected to the via 137, and an interconnect 141 is connected to the via 138. It should be noted that the interconnects 139, 140, and 141 are positioned on the dielectric layer 102 opposed to the surface 108.

As shown in FIG. 1, the acceptor wafer 253 includes a dielectric region 103 positioned proximate to the dielectric region 102. The dielectric region 103 is positioned proximal to the interconnects 139, 140, and 141. The vias 134 and 135 extend through the dielectric region 103. A via 145 is connected to the interconnect 139 and extends through the dielectric region 103. A via 142 is connected to the interconnect 140 and extends through the dielectric region 103. An interconnect 143 is positioned on the dielectric region 103, and the via 142 is connected thereto.

As shown in FIG. 1, the acceptor wafer 253 includes a dielectric region 104 positioned proximate to the dielectric region 102. The dielectric region 104 is positioned proximate to the interconnects 139, 140, and 141. The vias 134 and 135 extend through the dielectric region 104. The via 145 is connected to the interconnect 139 and extends through the dielectric region 103. The via 142 is connected to the interconnect 140 and extends through the dielectric region 103. The bypass interconnect 146 is positioned on the dielectric region 104, and the via 144 is connected thereto.

As shown in FIG. 1, the acceptor wafer 253 includes a dielectric region 105 positioned proximate to the dielectric region 104. The dielectric region 105 is positioned proximate to the bypass interconnect 146. The vias 134, 135, and 145 extend through the dielectric region 105. The bypass via 147 extends through the dielectric region 105, wherein the bypass via 147 is connected to the bypass interconnect 146. Further, the bypass via 130 extends through the dielectric region 105, wherein the bypass via 130 is connected to the bypass interconnect 146.

It should be noted that one end of the bypass via 147 is connected to the conductive bonding layer 148 and an opposed end is connected to the bypass interconnect 146. Further, one end of the bypass via 130 is connected to the conductive bonding layer 148 and an opposed end is connected to the bypass interconnect 146.

In some embodiments, the bypass via 130 is positioned away from the bypass via 147. In some embodiments, the bypass via 130 is parallel to the bypass via 147 in the sense that the bypass vias 147, and 130 are connected electrically parallel to each other between the bypass interconnect 146 and conductive bonding layer 148.

The bypass vias 147 and 130, the bypass interconnect 146, and the conductive bonding layer 148 are connected together to reduce the impedance thereof. Hence, the access time between various portions of the acceptor wafer 253 is reduced. Further, the acceptor wafer 253 can operate faster and it can process more data in a given amount of time. In this way, the acceptor wafer 233 includes interconnects and vias which are connected together in a way to reduce the impedance thereof.

In this embodiment, the conductive bonding layer 148 is positioned on the dielectric region 105. In this embodiment, the conductive bonding layer 148 includes a conductive material which has higher melting temperature than that of the conductive material of the vias and interconnects of the acceptor wafer 253. It is useful to include conductive material in conductive bonding layer 148 that can be reflowed to increase its uniformity. Reflowing conductive bonding layer 148 allows it to form a bonding interface with another material wherein the bonding interface is formed with a fewer number of voids and defects which can reduce the bond strength. In some embodiments, conductive bonding layer 148 can be planarized to increase its uniformity and to remove defects and impurities from its surface.

As shown in FIG. 1, the conductive bonding layer 148 includes a surface 175 which will be used to form a bonding interface, as will be discussed in more detail below. The surface 175 faces away from the dielectric region 105. The conductive bonding layer 148 forms a metal-to-dielectric growth interface with dielectric region 105. The conductive bonding layer 148 can include many different types of conductive materials, such as titanium, titanium nitride, tungsten, aluminum cobalt, or a combination thereof. In some embodiments, the conductive bonding layer 148 includes tungsten or a tungsten allow. In some embodiments, the conductive bonding layer 148 includes tungsten and a refractory metal. It should be noted that the interconnects and vias disclosed herein can include the same or similar materials as the conductive bonding layer 148. The bonding can be accomplished in many different ways, such as those disclosed in U.S. Pat. No. 7,470,142, the contents of which are incorporated herein by reference as though fully set forth herein.

Figure 3:
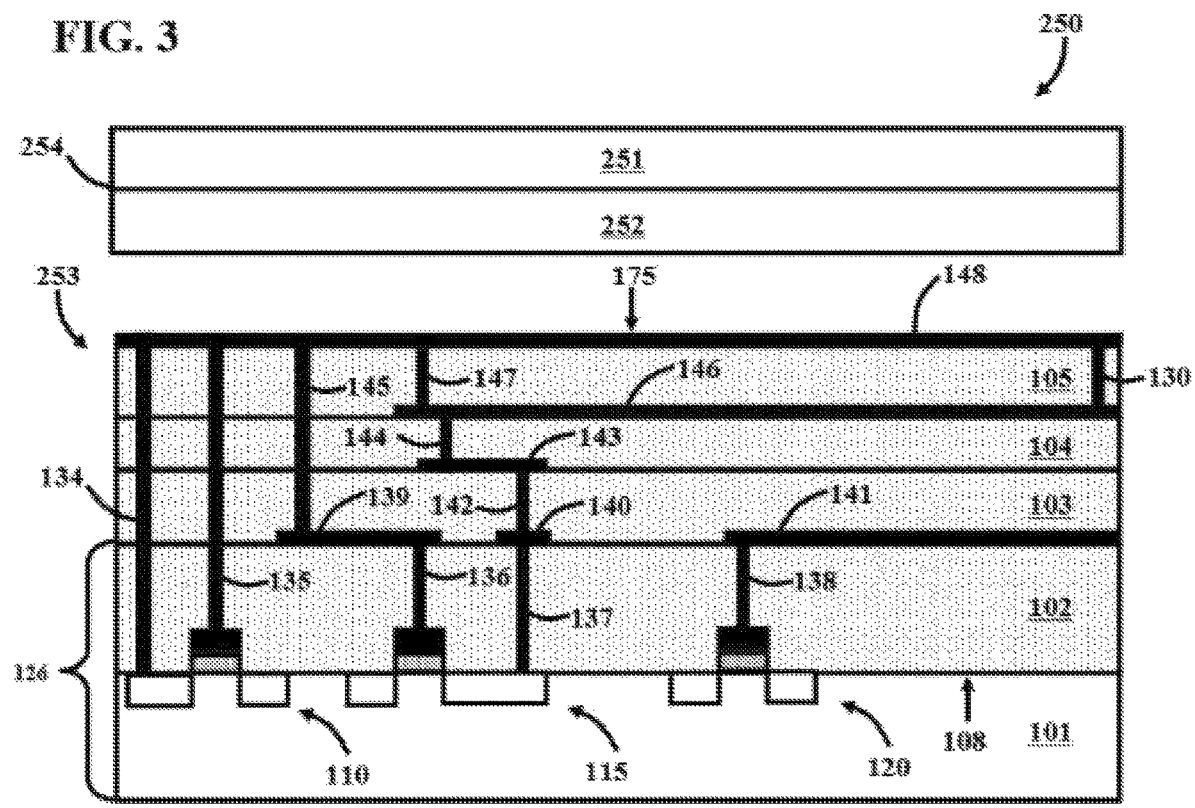
FIG. 3 is a sectional view of the acceptor wafer of FIG. 1, and a donor wafer positioned proximate to the conductive bonding layer.

FIG. 3 is a sectional view of the acceptor wafer 253 of FIG. 1, and a donor substrate 250 positioned proximate to the conductive bonding layer 148. In this embodiment, the donor wafer includes a device structure region 252 and bulk support region 251, and a detach region 254 which extends therebetween. More information regarding the detach region can be found in some of the references cited herein.

The donor wafer 165 can be of many different types of wafers. In this embodiment, the donor wafer 165 includes silicon. The silicon can be of many different types, such as single crystalline silicon. In some embodiments, the donor wafer 165 includes one or more doped layers, which are not shown for simplicity. As will be discussed in more detail below, the detach region 254 allows the device structure region 252 to be detached and transferred to the acceptor wafer 253.

In this embodiment, the donor wafer 165 is aligned with the acceptor wafer 253. The donor wafer 165 can be aligned with the acceptor wafer 253 in many different ways, such as by using wafer-to-wafer alignment. The donor wafer 165 is moved towards the surface 175 of the conductive bonding layer 148.

Figure 4:
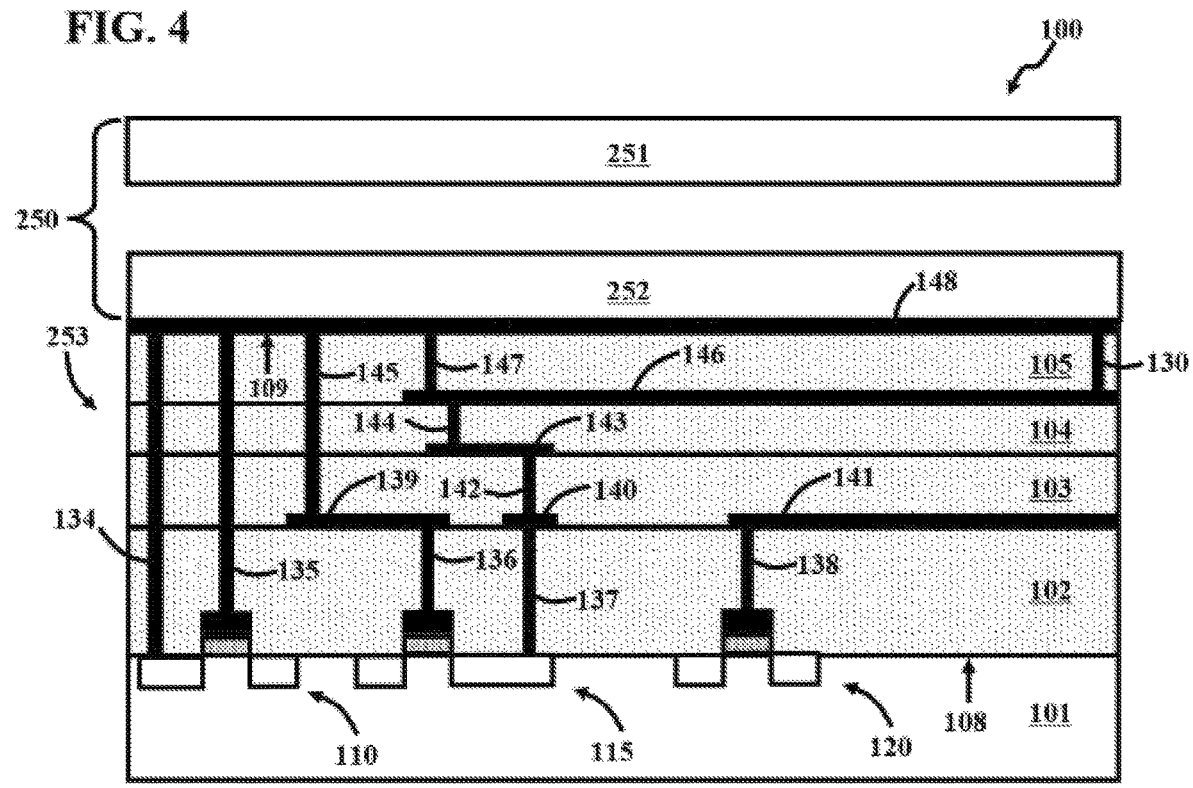
FIG. 4 is a sectional view of a bonded semiconductor structure, which includes the acceptor and donor wafers of FIG. 3 bonded together with the conductive bonding layer.

FIG. 4 is a sectional view of a bonded semiconductor structure 100, which includes the donor and acceptor wafers 165 and 168 of FIG. 3 bonded together with the conductive bonding layer 148 so that a bonding interface 109 is formed. The bonding can be accomplished in many different ways, such as those disclosed in U.S. Pat. No. 7,470,142, the contents of which are incorporated herein by reference as though folly set forth herein. In this embodiment, the donor wafer 165 is coupled to the conductive bonding layer 148 so it is bonded thereto. In particular, the device structure region 252 is coupled to the conductive bonding layer 148 so it is bonded thereto. The detach region 254 is cleaved through to separate the device structure region 252 from the bulk support region 251. The device structure region 252 is coupled to the acceptor wafer 253 through the bonding interface 109 so the bonded semiconductor structure 100 is formed. The bulk support region 251 is moved away from the device structure region 252. Further, the bulk support region 251 is moved away from the acceptor wafer 253.

It should be noted that the bonding interface 109 is formed using wafer-to-wafer alignment, which does not require a precise alignment between the donor substrate and support substrate 101. Hence, the alignment between the donor substrate and support substrate 101 can be accomplished fester using less expensive equipment. Being able to align the donor substrate and support substrate 101 fester increases the throughput when manufacturing a number of bonded semiconductor structures 100.

The device structure region 252 can include many different types of materials. The semiconductor material of device structure region 252 typically includes crystalline semiconductor material. In this embodiment, device structure region 252 includes crystalline semiconductor material. In particular, in this embodiment device structure region 252 include crystalline silicon. In other embodiments, device structure region 252 include other types of semiconductor material, such as polysilicon, silicon-germanium, silicon carbide, gallium nitride and gallium arsenide.

In some embodiments, the device structure region 252 includes single crystalline semiconductor material. In some embodiments, the semiconductor material of the device structure region 252 consists of crystalline semiconductor material. In some embodiments, the semiconductor material of the device structure region 252 consists essentially of crystalline semiconductor material.

In some embodiments, the semiconductor material of the device structure region 252 includes silicon. In some embodiments, the semiconductor material of the device structure region 252 consists of silicon. In some embodiments, the semiconductor material of the device structure region 252 consists essentially of silicon. In any of these embodiments, the semiconductor material of the device structure region 252 can include crystalline silicon.

In some embodiments, the semiconductor material of the device structure region 252 includes silicon-germanium. In some embodiments, the semiconductor material of the device structure region 252 consists of silicon-germanium. In some embodiments, the semiconductor material of the device structure region 252 consists essentially of silicon-germanium. In any of these embodiments, the semiconductor material of the device structure region 252 can include crystalline silicon-germanium.

In some embodiments, the semiconductor material of the device structure region 252 includes silicon carbide. In some embodiments, the semiconductor material of the device structure region 252 consists of silicon carbide. In some embodiments, the semiconductor material of the device structure region 252 consists essentially of silicon carbide. In any of these embodiments, the semiconductor material of the device structure region 252 can include crystalline silicon carbide.

In some embodiments, the semiconductor material of the device structure region 252 includes gallium nitride. In some embodiments, the semiconductor material of the device structure region 252 consists of gallium nitride. In some embodiments, the semiconductor material of the device structure region 252 consists essentially of gallium nitride. In any of these embodiments, the gallium arsenide can include crystalline gallium nitride.

In some embodiments, the semiconductor material of the device structure region 252 includes gallium arsenide. In some embodiments, the semiconductor material of the device structure region 252 consists of gallium arsenide. In some embodiments, the semiconductor material of the device structure region 252 consists essentially of gallium arsenide. In any of these embodiments, the gallium arsenide can include crystalline gallium arsenide.

It should be noted that the device structure region 252 typically includes silicon material when it is desired to form a semiconductor memory circuit. However, the device structure region 252 can include other types of semiconductor materials, such as those mentioned above, if it is desired to form other types of circuits, such as high power and high frequency transistors, as well as optical devices, such as semiconductor lasers, light emitting diodes and photosensors.

It should also be noted that, in some embodiments, the device structure region 252 includes a single layer of semiconductor material with stacked differently doped semiconductor regions and, in other embodiments, the device structure region 252 includes a plurality of differently doped semiconductor layers. In embodiments wherein the device structure region 252 includes a single layer of semiconductor material with stacked differently doped semiconductor layers, the stacked differently doped semiconductor regions are formed using ion implantation or doped during epitaxial growth. In embodiments wherein the device structure region 252 includes a plurality of differently doped semiconductor layers, the differently doped semiconductor layers are doped during epitaxial growth, although they can be doped using ion implantation, if desired.

It should also be noted that the device structure region 252 can include doped regions that are uniformly doped and doped regions that are non-uniformly doped. More information regarding doped regions that are uniformly doped and non-uniformly doped can be found in U.S. Pat. No. 7,470,595, the contents of which are incorporated herein by reference as though fully set forth herein.

As mentioned above, the transfer of the device structure region 252 can involve the use of a detach region, wherein the detach region can include many different types of material. In one embodiment, the material of the detach region has a lower mechanical strength than the material of the bulk support region 251 and the device structure region 252. In another embodiment, the material of the detach region has a higher etch rate than the material of the bulk support region 251 and the device structure region 252.

Examples of material that can be included with the detach region include porous silicon. Porous silicon can be formed in many different ways. One way of forming porous silicon is disclosed in U.S. Pat. No. 6,330,099. Porous silicon includes a number of pores extending therethrough, which reduces its mechanical strength compared to crystalline silicon. Further, porous silicon includes a number of pores extending therethrough, which increases it's etch rate compared to crystalline silicon. Other examples of material that can be included with the detach region include an oxide material, nitride material, organic bonding material or a strained layer formed by semiconductor layers having different lattice constants. One example of semiconductor layers having different lattice constants is silicon-germanium.

In some embodiments, the detach layer can include one or more implanted species, such as hydrogen, wherein the lattice structure of the material of the detach layer is damaged in response to receiving the implanted species. One technique for forming the detach layer with an implanted species is disclosed in U.S. Pat. No. 5,374,564.

It should be noted that the material of the detach region and its method of formation, typically depends on the material of the semiconductor layer stack. For example, the detach region can include an alloy of gallium nitride when the device structure region 252 includes gallium nitride. In one particular example, the bulk support region 251 includes sapphire or silicon carbide and detach region includes a material typically used as a buffer layer to form gallium nitride on sapphire and silicon carbide substrates. Buffer layers used to form gallium nitride on sapphire and silicon carbide substrates include III-V nitride semiconductor material, such as indium gallium nitride and aluminum gallium nitride.

It should be noted that, in the embodiments wherein the device structure region 252 includes gallium nitride, the method of manufacturing the bonded semiconductor structure 100 can include a step of using laser ablation to decouple the donor substrate body region from the semiconductor layer stack. More information regarding laser ablation can be found in U.S. Pat. Nos. 6,413,839, 6,849,524 and 6,902,990, as well as the references cited above by the same inventor.

The detach region can include an alloy of gallium arsenide when the device structure region 252 includes gallium arsenide. The detach region can include an alloy of a III-V compound semiconductor material when the device structure region 252 includes gallium arsenide.

The detach region can include an alloy of silicon carbide when the semiconductor device structure region 252 includes silicon carbide. In one particular example, the detach region includes a polytype of silicon carbide and the device structure region 252 includes a different polytype of silicon carbide.

As mentioned above, in some embodiments, the material of the detach region is easier to etch than the material of the device structure region 252. In some embodiments, the material of the detach region has a lower mechanical strength than the material of the device structure region 252.

Figure 5:
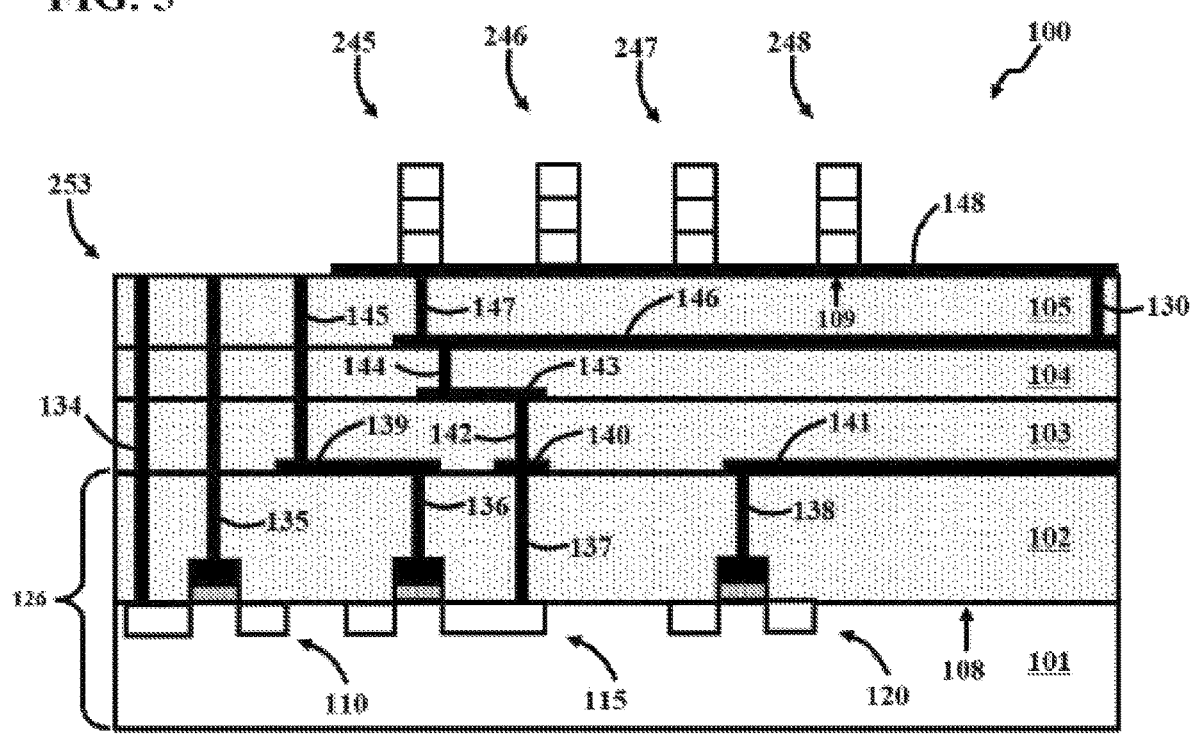
FIG. 5 is a sectioned view of the bonded semiconductor structure of FIG. 4, wherein the donor wafer has been processed to form a plurality of mesa structures.

FIG. 5 is a sectional view of the bonded semiconductor structure 100 of FIG. 4, wherein the donor wafer 165 has been processed to form a plurality of mesa structures 245, 246, 247, and 248. In particular, the device structure region 252 is processed to form the mesa structures mesa structures 245, 246, 247, and 248. The mesa structures mesa structures 245, 246, 247, and 248 are coupled to the acceptor wafer 253 through the conductive bonding layer 148. Further, the mesa structures mesa structures 245, 246, 247, and 248 are coupled to the acceptor wafer through the bonding interface 109. The conductive bonding layer 148 is processed to remove a portion thereof so that the vias 134, 135, and 145 are exposed. In tins embodiment, the via 147 is positioned proximate to the mesa structure 160. Further, the via 130 is positioned away from the mesa structures mesa structures 245, 246, 247, and 248.

The mesa structures mesa structures 245, 246, 247, and 248 can be formed in many different ways. In this embodiment, the device structure region 252 includes a stack of semiconductor layers, which are etched to form one or more mesa structures. More details regarding the device structure region 252 is provided with the discussion of FIGS. 6 and 7. The etching and formation of the mesa structures typically involves the use of one or more mask layers.

More information regarding forming mesa structures can be found in U.S. patent application Ser. Nos. 11/092,500, 11/092,501 and 11/180,286, as well as U.S. Pat. Nos. 7,470,598 and 7,470,142, all of which are incorporated herein by reference as though fully set forth herein. Further, more information regarding mesa structures can be found in the references cited above by the same inventor.

Figure 6:
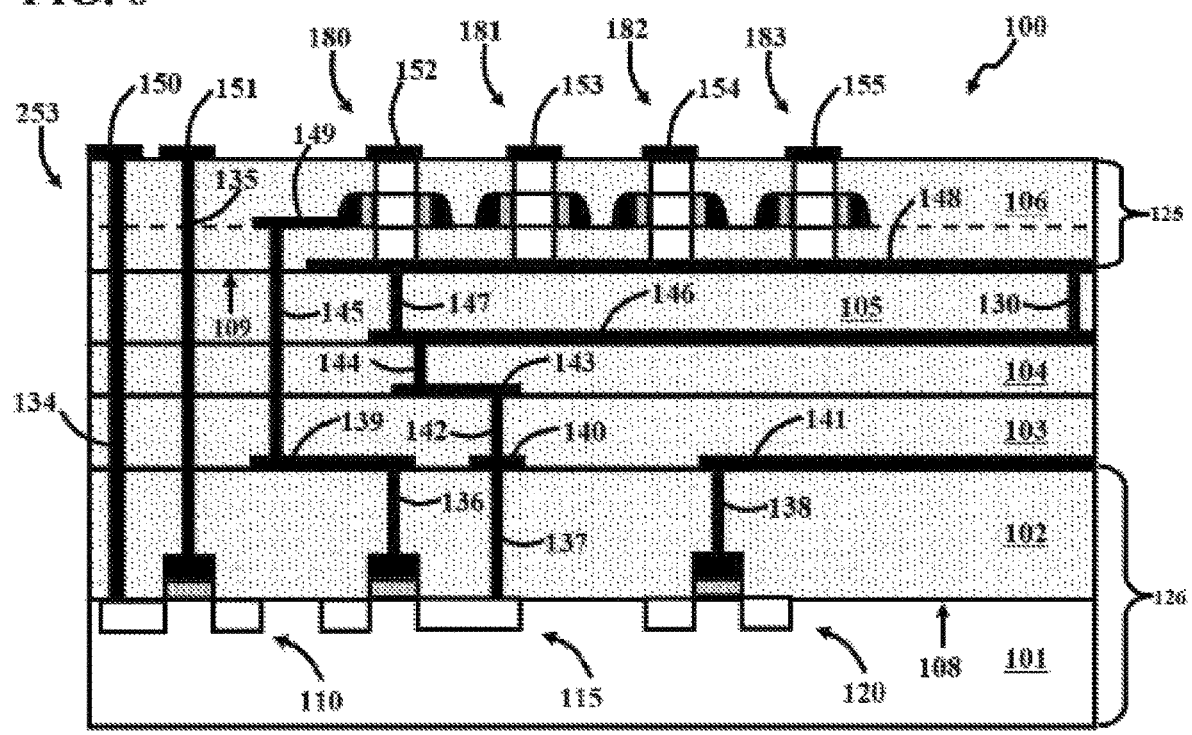
FIG. 6 is a sectional view of one embodiment of the bonded semiconductor structure, wherein a plurality of vertical transistors have been formed with the plurality of mesa structures of FIG. 5.
Figure 7:
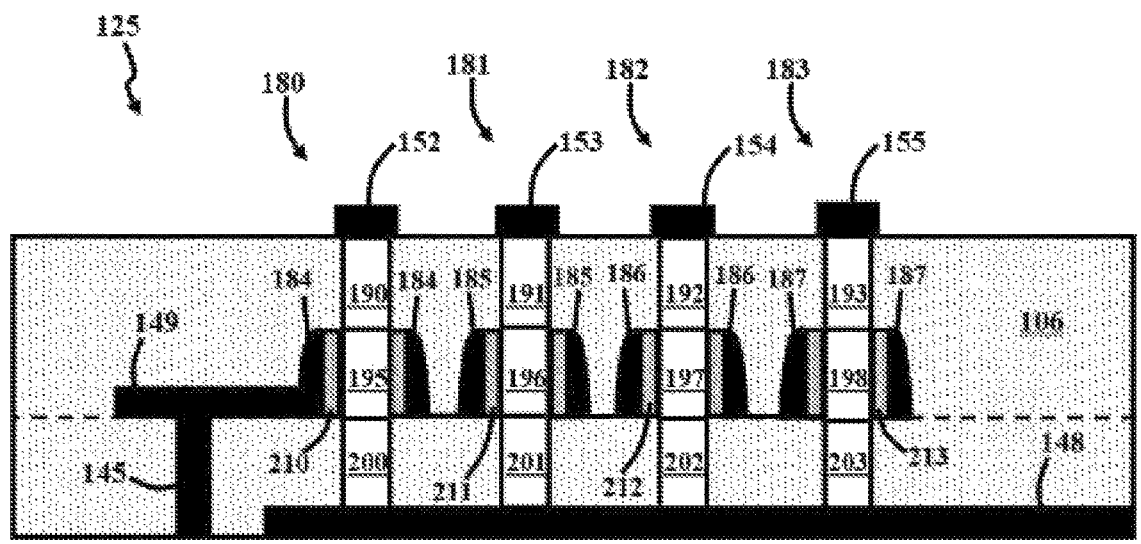
FIG. 7 is a sectional view of a vertical device region of the bonded semiconductor structure of FIG. 6.

FIG. 6 is a sectional view of one embodiment of the bonded semiconductor structure 100, and FIG. 7 show a vertical device region 125 of FIG. 6. More information regarding making and using semiconductor structures can be found in U.S. Pat. Nos. 7,052,941, 7,378,702, 7,470,142, 7,470,598, 7,632,738, 7,633,162, 7,671,371, 7,718,508, 7,799,675, 7,800,199, 7,846,814, 7,863,748, 7,867,822, 7,888,764, 8,018,058, 8,058,142, 8,071,438, 8,367,524, 8,455,978, 8,471,263, 8,723,335, 8,779,597, 8,891,324, and 9,012,292, the contents of all of which are incorporated herein by reference as though fully set forth herein.

In this embodiment, the bonded semiconductor structure 100 includes the acceptor wafer 253. Hence, the bonded semiconductor structure 100 includes interconnects and vias which are connected together in a way to reduce the impedance thereof. In this way, the access time between various portions of the bonded semiconductor structure 100 is reduced. Hence, the bonded semiconductor structure 100 can operate faster and it can process more data in a given amount of time.

Some of the steps of manufacturing the bonded semiconductor structure 100 include steps of providing a structure, such as an acceptor substrate, substrate, interconnect region, etc., and it should be noted that the bonded semiconductor structure 100 can be provided in many different ways. For example, in some situations, a user provides the bonded semiconductor structure 100 by manufacturing it and, in other situations, the user provides the bonded semiconductor structure 100 by acquiring it, such as from a manufacturer. Some of the steps include steps of forming a structure, such as a substrate, interconnect region, conductive line, transistor, etc., and it should be noted that the structure can be formed in many different ways. For example, in some situations, the bonded semiconductor structure 100 is formed by the user and, in other situations, the bonded semiconductor structure 100 is formed by someone else and then provided to the user. The structures can be formed in many different ways, such as by growth, deposition, etc. Steps in forming the structures can include steps of photolithography and etching, as well as some of the steps mentioned below.

As mentioned above, the conductive bonding layer 148 is positioned on the dielectric region 105. It should be noted that one end of the bypass via 147 is connected to the conductive bonding layer 148 and an opposed end is connected to the bypass interconnect 146. Further, one end of the bypass via 130 is connected to the conductive bonding layer 148 and an opposed end is connected to the bypass interconnect 146.

In some embodiments, the bypass via 130 is positioned away from the bypass via 147. In some embodiments, the bypass via 130 is parallel to the bypass via 147 in the sense that bypass vias 130 and 147 are connected electrically parallel to each other between the bypass interconnect 146 and conductive bonding layer 148.

The bypass via 147 is positioned proximate to the vertical transistor 180, and extends away therefrom towards the bypass interconnect 146. The bypass via 130 is positioned away from the vertical transistors 180, 181, 182, and 183. The bypass vias 130 and 147, the bypass interconnect 146, and the conductive bonding layer 148 are connected together to reduce the impedance thereof. Hence, the access time between various portions of the bonded semiconductor structure 100 is reduced. Further, the bonded semiconductor structure 100 can operate faster and it can process more data in a given amount of time. In this way, the bonded semiconductor structure 100 includes interconnects and vias which are connected together in a way to reduce the impedance thereof.

The conductive bonding layer 148 includes the bonding interface 109, as will be discussed in more detail below. The conductive bonding layer 148 forms a metal-to-dielectric growth interface with dielectric region 105. The conductive bonding layer 148 can include many different types of conductive materials, such as titanium, titanium nitride, tungsten, aluminum cobalt, or a combination thereof. In some embodiments, the conductive bonding layer 148 includes tungsten or a tungsten allow. In some embodiments, the conductive bending layer 148 includes tungsten and a refractory metal. It should be noted that the interconnects and vias disclosed herein can include the same or similar materials as the conductive bonding layer 148. The bonding can be accomplished in many different ways, such as those disclosed in U.S. Pat. No. 7,470,142, the contents of which are incorporated herein by reference as though fully set forth herein.

In this embodiment, and as shown in FIGS. 6 and 7, the bonded semiconductor structure 100 includes a dielectric region 106 positioned proximate to the dielectric region 105. The dielectric region 106 is positioned proximate to the conductive bonding layer 148. The vias 134, 135, and 145 extend through the dielectric region 106. An interconnect 149 is connected to the via 145. An interconnect 150 is connected to the via 134, and an interconnection 151 is connected to the via 135.

In general the bonded semiconductor structure 100 includes one or more vertical devices. The vertical devices can be of many different types, such as a diode and transistor. In this embodiment, the bonded semiconductor structure 100 includes vertical transistors 180, 181, 182, and 183. The vertical transistors 180, 181, 182, and 183 extend through the dielectric region 106.

In this embodiment, the vertical transistor 180 includes semiconductor layers 190, 195, and 200, wherein the semiconductor layer 200 is adjacent to the conductive bonding layer 148, and the semiconductor layer 190 is spaced from the semiconductor layer 200 by the semiconductor layer 195. In this way, the semiconductor layers 190, 195, and 200 form the mesa structure 160 (FIG. 5) which is coupled to the support substrate 101 through the conductive bonding layer 148, and the bonding interface 109 is formed therebetween.

In this embodiment, the vertical transistor 180 includes a control terminal 184 and control dielectric 210, wherein the control terminal 184 is spaced from the semiconductor layer 195 by the control dielectric 210. The control terminal 184 and control dielectric 210 extend around the semiconductor layer 195. In this embodiment, an interconnect 152 is coupled to the semiconductor layer 190.

The semiconductor layers 190 and 200 operate as a source and drain, respectively, of the vertical transistor 180. The semiconductor layer 195 operates as a channel region with a conductivity that can be controlled in response to a control signal applied to the control terminal 184.

In this embodiment, the vertical transistor 181 includes the semiconductor layers 191, 196, and 201, wherein the semiconductor layer 201 is adjacent to the conductive bonding layer 148, and the semiconductor layer 191 is spaced from the semiconductor layer 201 by the semiconductor layer 196. In this way, the semiconductor layers 191, 196, and 201 form the mesa structure 161 (FIG. 5) which is coupled to the support substrate 101 through the conductive bonding layer 148, and the bonding interface 109 is formed therebetween.

In this embodiment, the vertical transistor 181 includes a control terminal 185 and control dielectric 211, wherein the control terminal 185 is spaced from the semiconductor layer 196 by the control dielectric 211. The control terminal 185 and control dielectric 211 extend around the semiconductor layer 196. In this embodiment, an interconnect 153 is coupled to the semiconductor layer 191.

The semiconductor layers 191 and 201 operate as a source and drain, respectively, of the vertical transistor 181. The semiconductor layer 196 operates as a channel region with a conductivity that can be controlled in response to a control signal applied to the control terminal 185.

In this embodiment, the vertical transistor 182 includes the semiconductor layers 192, 197, and 202, wherein the semiconductor layer 202 is adjacent to the conductive bonding layer 148, and the semiconductor layer 192 is spaced from the semiconductor layer 202 by the semiconductor layer 197. In this way, the semiconductor layers 192, 197, and 202 form the mesa structure 162 (FIG. 5) which is coupled to the support substrate 101 through the conductive bonding layer 148, and the bonding interlace 109 is formed therebetween.

In this embodiment, the vertical transistor 182 includes a control terminal 186 and control dielectric 212, wherein the control terminal 186 is spaced from the semiconductor layer 197 by the control dielectric 212. The control terminal 186 and control dielectric 212 extend around the semiconductor layer 197. In this embodiment, an interconnect 154 is coupled to the semiconductor layer 192.

The semiconductor layers 192 and 202 operate as a source and drain, respectively, of the vertical transistor 182. The semiconductor layer 197 operates as a channel region with a conductivity that can be controlled in response to a control signal applied to the control terminal 186.

In this embodiment, the vertical transistor 183 includes the semiconductor layers 193, 198, and 203, wherein the semiconductor layer 203 is adjacent to the conductive bonding layer 148, and the semiconductor layer 193 is spaced from the semiconductor layer 203 by the semiconductor layer 198. In this way, the semiconductor layers 193, 198, and 203 form the mesa structure 163 (FIG. 5) which is coupled to the support substrate 101 through the conductive bonding layer 148, and the bonding interlace 109 is formed therebetween.

In this embodiment, the vertical transistor 183 includes a control terminal 187 and control dielectric 213, wherein the control terminal 187 is spaced from the semiconductor layer 198 by the control dielectric 213. The control terminal 187 and control dielectric 213 extend around the semiconductor layer 198. In this embodiment, an interconnect 155 is coupled to the semiconductor layer 193. It should be noted that, in this embodiment, the control terminals 184, 185, 186, and 187 are connected together. Further, the control terminals 184, 185, 186, and 187 are connected to the interconnect 149.

The semiconductor layers 193 and 203 operate as a source and drain, respectively, of the vertical transistor 183. The semiconductor layer 198 operates as a channel region with a conductivity that can be controlled in response to a control signal applied to the control terminal 187

It should be noted that the vias 136 and 145 and interconnects 139 and 149 operate as a word line, wherein the word line is connected between the control terminal 119 (FIG. 2) and the control terminal 184 (FIG. 7). Further, the vias 137, 142, 144, 147, 130, interconnects 140, 143, the bypass interconnect 146, and the conductive bonding layer 148 operate as a bit line, wherein the bit line is connected between the dram 117 (FIG. 2) and the vertical transistors 180, 181, 182, and 183.

A bonding interface is an interface that is formed in response to bonding material layers together. In one example of forming a bonding interface, first and second material layers are formed as separate layers, and moved towards each other so they engage each other and the bonding interface is formed in response. In this way, a bonding interface is established. It should be noted that heat is generally applied to the first and/or second material layers to facilitate the formation of the bonding interface. In a metal-to-metal bonding interface, the first and second material layers that are bonded together are conductive materials, suck as metals. In a metal-to-dielectric bonding interface, one of the first and second material layers is a conductive material and the other one is a dielectric material. In a metal-to-semiconductor bending interface, one of the first and second material layers is a conductive material and the other one is a semiconductor material.

A growth interface is an interface that is formed in response to growing a material layer on another material layer. In one example of forming a growth interface, a third material layer is formed, and a fourth material layer is grown on the third material layer so that the growth interface is formed in response. In this way, a growth interface is established. The fourth material layer can be grown on the third material layer in many different ways, such as by chemical vapor deposition and sputtering. Hence, when forming a growth interface, third and fourth material layers are not formed as separate layers, and moved to engage each other.

In a metal-to-metal growth interface, the third and fourth material layers are conductive materials, such as metals. In a metal-to-dielectric growth interface, one of the third and fourth material layers is a conductive material, and the other one is a dielectric material. In a metal-to-semiconductor growth interface, one of the third and fourth material layers is a conductive material, and the other one is a semiconductor material. In a dielectric-to-dielectric growth interlace the third and fourth materials are dielectric materials.

It should be noted that, in general it is difficult to establish a metal-to-semiconductor growth interface, wherein the semiconductor material is grown on the metal layer. Further, it is difficult to grow a crystalline semiconductor material layer on a metal layer using semiconductor growth techniques, such as chemical vapor deposition. In most instances, the metal layer is formed on the semiconductor material. It is difficult to grow semiconductor material on a metal law because metal layers do not operate as a very good seed layer for the semiconductor material. Hence, a significant amount of the semiconductor material will not agglomerate on the metal layer.

It is difficult to grow crystalline semiconductor material on the metal layer because metal layers tend to not be crystalline, and semiconductor material tends to have the crystal structure of the material it is formed on. Hence, if a semiconductor material is formed on a metal layer that includes non-crystalline conductive material then the semiconductor material will also have a non-crystalline crystal structure and poor material quality. Thus, it is useful to bond crystalline semiconductor material to a metal layer to form a metal-to-semiconductor bonding interface.

In general bonding and growth interfaces have different types and amounts of defects. For example, dislocations often extend from a growth interface in the direction of material growth. The difference between bonding and growth interfaces can be determined in many different ways, such as by using Transmission Electron Microscopy (TEM) to determine the type and amount of defects proximate to the interface. Information regarding TEM can be found in U.S. Pat. Nos. 5,892,225, 6,531,697, 6,822,233 and 7,002,152, as well as in the references cited above by the same inventor.

More information regarding bonding and growth interfaces can be found in related U.S. patent application Ser. No. 11/606,523, the contents of which are incorporated herein by reference as though fully set forth herein. Information regarding bonding and growth interfaces can also be found in U.S. Pat. Nos. 5,152,857, 5,695,557, 5,980,633 and 6,534,382, as well as in the references cited above by the same inventor.

Figure 8:
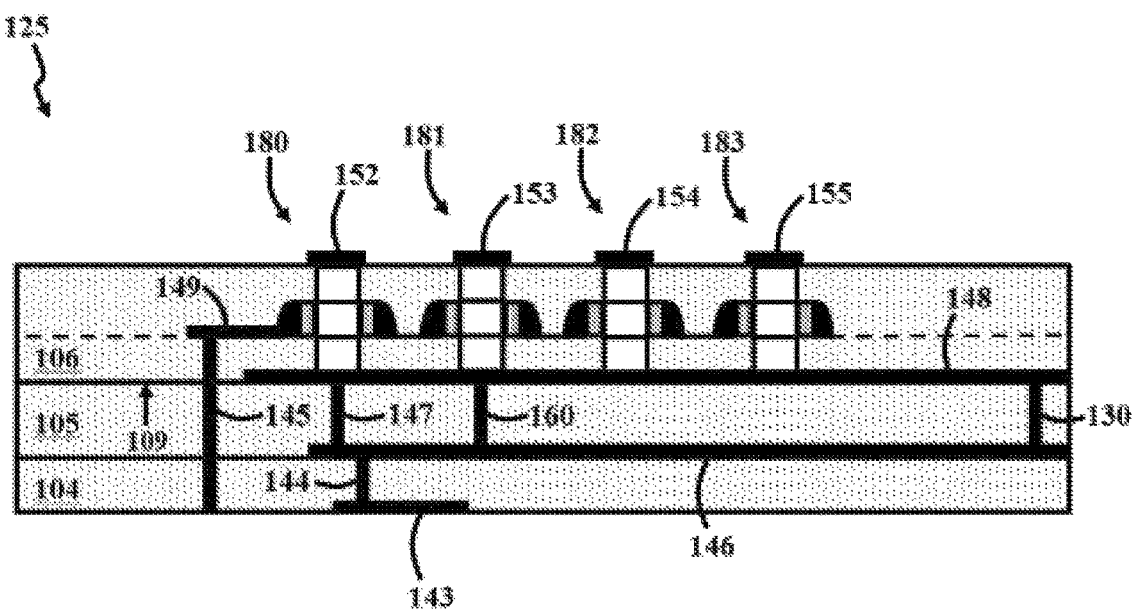
FIG. 8 is another embodiment of a portion of the bonded semiconductor structure of FIG. 6, wherein three vias extend between the conductive bonding layer and the first interconnect.

FIG. 8 is another embodiment of the vertical device region 125 of the bonded semiconductor structure 100. In this embodiment, the vertical device region 125 includes a bypass via 160, which extends between the bypass interconnect 146 and conductive bonding layer 148. In some embodiments, the bypass via 160 is positioned between the vias 147 and 130. In some embodiments, the bypass via 160 is parallel to the bypass vias 130 and 147 in the sense that bypass vias 130, 147, and 160 are connected electrically parallel to each other between the bypass interconnect 146 and conductive bonding layer 148.

The bypass via 147 is positioned proximate to the vertical transistor 180, and extends away therefrom towards the bypass interconnect 146. The bypass via 160 is positioned proximate to the vertical transistor 181, and extend away therefrom towards the bypass interconnect 146. The bypass via 130 is positioned away from the vertical transistors 180, 181, 182, and 183.

One end of the bypass via 147 is connected to the conductive bonding layer 148 and the opposed end is connected to the bypass interconnect 146. One end of the bypass via 160 is connected to the conductive bonding layer 148 and the opposed end is connected to the bypass interconnect 146. One end of the bypass via 130 is connected to the conductive bonding layer 148 and the opposed end is connected to the bypass interconnect 146.

The bypass vias 130, 147, and 160, the bypass interconnect 146, and the conductive bonding layer 148 are connected together to reduce the impedance thereof. Hence, the access time between various portions of the bonded semiconductor structure 100 is reduced. Further, the bonded semiconductor structure 100 can operate fester and it can process more data in a given amount of time. In this way, the bonded semiconductor structure 100 includes interconnects and vias which are connected together in a way to reduce the impedance thereof.

Figure 9:
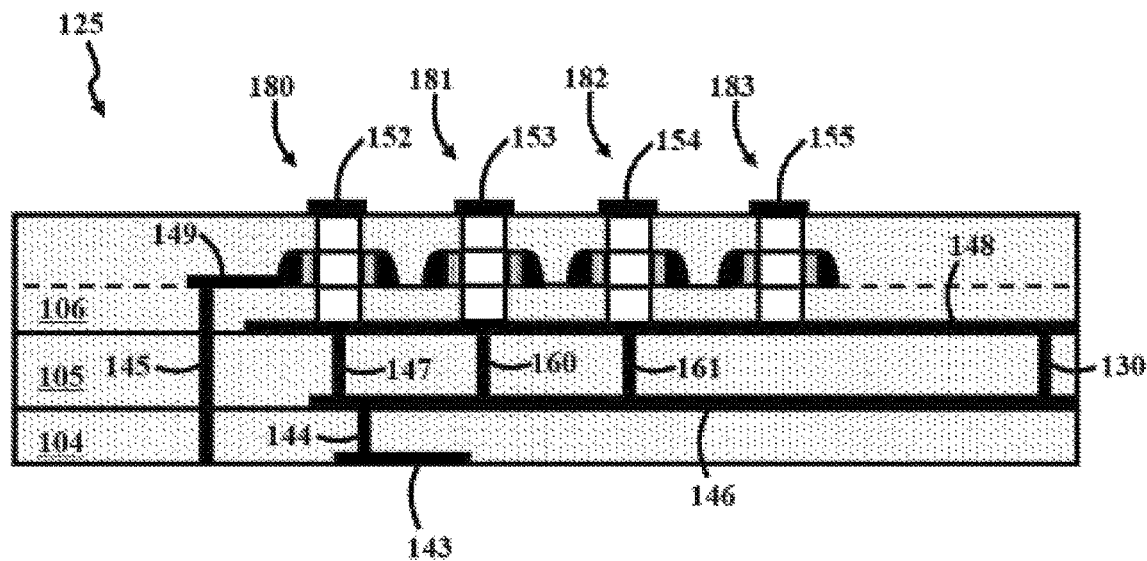
FIG. 9 is another embodiment of a portion of the bonded semiconductor structure of FIG. 6, wherein four vias extend between the conductive bonding layer and the first interconnect.

FIG. 9 is another embodiment of the vertical device region 125 of the bonded semiconductor structure 100. In this embodiment, the vertical device region 125 includes a bypass via 161, which extends between the bypass interconnect 146 and conductive bonding layer 148. In some embodiments, the bypass via 161 is positioned between the bypass vias 130 and 160. In some embodiments, the bypass via 161 is parallel to the bypass vias 130, 147, and 160 in the sense that bypass vias 130, 147, 160, and 161 are connected electrically parallel to each other between the bypass interconnect 146 and conductive bending layer 148.

The bypass via 147 is positioned proximate to the vertical transistor 180, and extends away therefrom towards the bypass interconnect 146. The bypass via 160 is positioned proximate to the vertical transistor 181, and extends away therefrom towards the bypass interconnect 146. The bypass via 161 is positioned proximate to the vertical transistor 182, and extends away therefrom towards the bypass interconnect 146. The bypass via 130 is positioned away from the vertical transistors 180, 183, 182, and 183.

One end of the bypass via 147 is connected to the conductive bonding layer 148 and the opposed end is connected to the bypass inter connect 146. One end of the bypass via 160 is connected to the conductive bonding layer 148 and the opposed end is connected to the bypass interconnect 146. One end of the bypass via 161 is connected to the conductive bonding Layer 148 and the opposed end is connected to the bypass interconnect 146. One end of the bypass via 130 is connected to the conductive bonding layer 14S and the opposed end is connected to the bypass interconnect 146.

The bypass vias 130, 147, 160, and 161, the bypass interconnect 146, and the conductive bonding layer 148 are connected together to reduce the impedance thereof. Hence, the access time between various portions of the bonded semiconductor structure 100 is reduced. Further, the bonded semiconductor structure 100 can operate faster and it can process more data in a given amount of time. In this way, the bonded semiconductor structure 100 includes interconnects and vias which are connected together in a way to reduce the impedance thereof.

Figure 10:
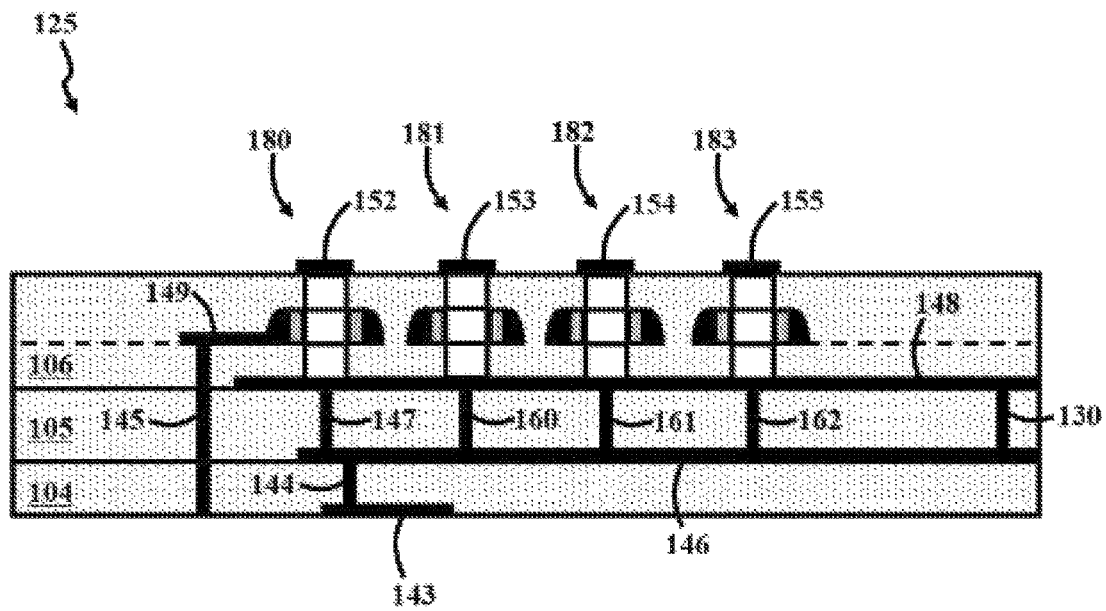
FIG. 10 is another embodiment of a portion of the bonded semiconductor structure of FIG. 6, wherein five vias extend between the conducive bonding layer and the first interconnect.

FIG. 10 is another embodiment of the vertical device region 125. In this embodiment, the vertical device region 125 includes a bypass via 162, which extends between the bypass interconnect 146 and conductive bonding layer 148. In some embodiments, the bypass via 162 is positioned between the bypass vias 130 and 161. In some embodiments, the bypass via 162 is parallel to the bypass vias 130, 147, 160, and 161 in the sense that the bypass vias 130, 147, 160, 161, and 162 are connected electrically parallel to each other between the bypass interconnect 146 and conductive bonding layer 148.

The bypass via 147 is positioned proximate to the vertical transistor 180, and extends away therefrom towards the bypass interconnect 146. The bypass via 160 is positioned proximate to the vertical transistor 181, and extends away therefrom towards the bypass interconnect 146. The bypass via 161 is positioned proximate to the vertical transistor 182, and extends away therefrom towards the bypass interconnect 146. The bypass via 162 is positioned proximate to the vertical transistor 183, and extends away therefrom towards the bypass interconnect 146. The bypass via 130 is positioned away from the vertical transistors 180, 181, 182, and 183.

One end of the bypass via 147 is connected to the conductive bonding layer 145 and the opposed end is connected to the bypass interconnect 146. One end of the bypass via 160 is connected to the conductive bonding layer 148 and the opposed end is connected to the bypass interconnect 146. One end of the bypass via 161 is connected to the conductive bonding layer 148 and the opposed end is connected to the bypass interconnect 146. One end of the bypass via 162 is connected to the conductive bonding layer 14S and the opposed end is connected to the bypass interconnect 146. One end of the bypass via 130 is connected to the conductive bonding layer 148 and the opposed end is connected to the bypass interconnect 146.

The bypass vias 130, 147, 160, 161, and 162, the bypass interconnect 146, and the conductive bonding layer 148 are connected together to reduce the impedance thereof. Hence, the access time between various portions of the bonded semiconductor structure 100 is reduced. Further the bonded semiconductor structure 100 can operate faster and it can process more data in a given amount of time. In this way, the bonded semiconductor structure 100 includes interconnects and vias which are connected together in a way to reduce the impedance thereof.

Figure 11:
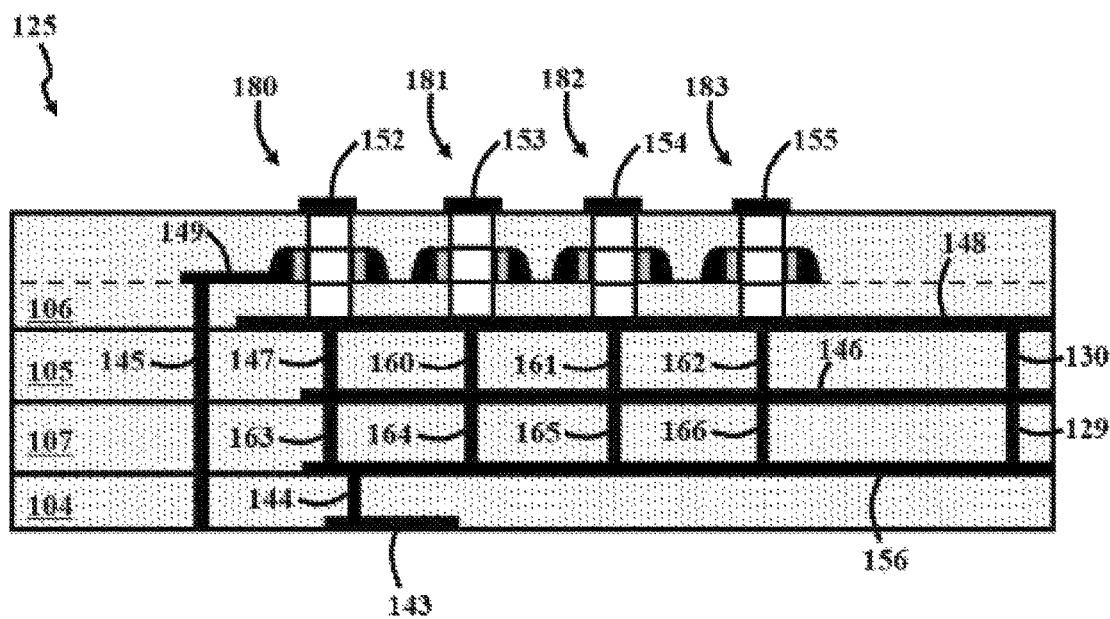
FIG. 11 is another embodiment of a portion of the bonded semiconductor structure of FIG. 6, wherein five vias extend between the conductive bonding layer and a second interconnect and five vias extend between the fast and second interconnects.

FIG. 11 is another embodiment of the vertical device region 125. In this embodiment, the vertical device region 125 includes a dielectric region 107 positioned proximate to the dielectric regions 104 and 105 of FIG. 5. In particular, the dielectric region 105 is spaced from the dielectric region 104 by the dielectric region 107. In some embodiments, the dielectric region 107 extends between the dielectric regions 104 and 105. The dielectric region 107 is positioned proximate to a bypass interconnect 156 which is positioned on the dielectric region 104. The via 145 extends through the dielectric region 107, and the via 144 and interconnect 143 extend through the dielectric region 104. The bypass interconnect 146 is positioned on the dielectric region 107 opposed to the bypass interconnect 156 and conductive bonding layer 148. The dielectric region 105 is positioned proximate to the bypass interconnect 146, as described in more detail above.

The bypass vias 130, 147, 160, 161, and 162 extend through the dielectric region 105, wherein the bypass vias 130, 147, 160, 161, and 162 are connected to the bypass interconnect 146. In particular, one end of the bypass vias 130, 147, 160, 161, and 162 are connected to the conductive bonding layer 148 and an opposed end are connected to the bypass interconnect 146. In some embodiments, the bypass vias 130 147, 160, 161, and 162 are parallel each other in the sense that bypass vias 130, 147, 160, 161, and 162 are connected electrically parallel to each other between the bypass interconnect 146 and conductive bonding layer 148.

The bypass via 147 is positioned proximate to the vertical transistor 180, and extends away therefrom towards the bypass interconnect 146. The bypass via 160 is positioned proximate to the vertical transistor 181, and extends away therefrom towards the bypass interconnect 146. The bypass via 161 is positioned proximate to the vertical transistor 182, and extends away therefrom towards the bypass interconnect 146. The bypass via 162 is positioned proximate to the vertical transistor 183, and extends away therefrom towards the bypass interconnect 146. The bypass via 130 is positioned away from the vertical transistors 180, 181, 182, and 183 and extends between the bypass interconnect 146 and conductive bonding layer 148.

In this embodiment, the bonded semiconductor structure 100 includes the bypass vias 163, 164, 165, 166, and 129 which extend through the dielectric region 107, wherein the bypass vias 163, 164, 165, 166, and 129 are connected to the bypass interconnect 156. In particular, one end of the bypass vias 163, 164, 165, 166, and 129 are connected to the bypass interconnect 156 and an opposed end are connected to the bypass interconnect 146. In some embodiments, the bypass vias 163, 164, 165, 166, and 129 are parallel each other in the sense that the bypass vias 163, 164, 165, 166, and 129 are connected electrically parallel to each other between the bypass interconnects 146 and 156.

The bypass via 163 is positioned proximate to the bypass via 147, and extends away therefrom towards the bypass interconnect 156. The bypass via 164 is positioned proximate to the bypass via 160, and extends away therefrom towards the bypass interconnect 156. The bypass via 165 is positioned proximate to the bypass via 161, and extends away therefrom towards the bypass interconnect 156. The bypass via 166 is positioned proximate to the bypass via 162, and extends away therefrom towards the bypass interconnect 156. The bypass via 129 is positioned away from the bypass vias 147, 160, 161, and 162 and extends between the bypass interconnects 146 and 156.

The bypass vias 147, 160, 161, 162, 130, 163, 164, 165, 166, and 130, the bypass interconnects 146 and 156, and the conductive bonding layer 148 are connected together to reduce the impedance thereof. Hence, the access time between various portions of the bonded semiconductor structure 100 is reduced. Further, the bonded semiconductor structure 100 can operate taster and it can process mere data in a given amount of time. In this way the bonded semiconductor structure 100 includes interconnects and vias which are connected together in a way to reduce the impedance thereof.

Figure 12:
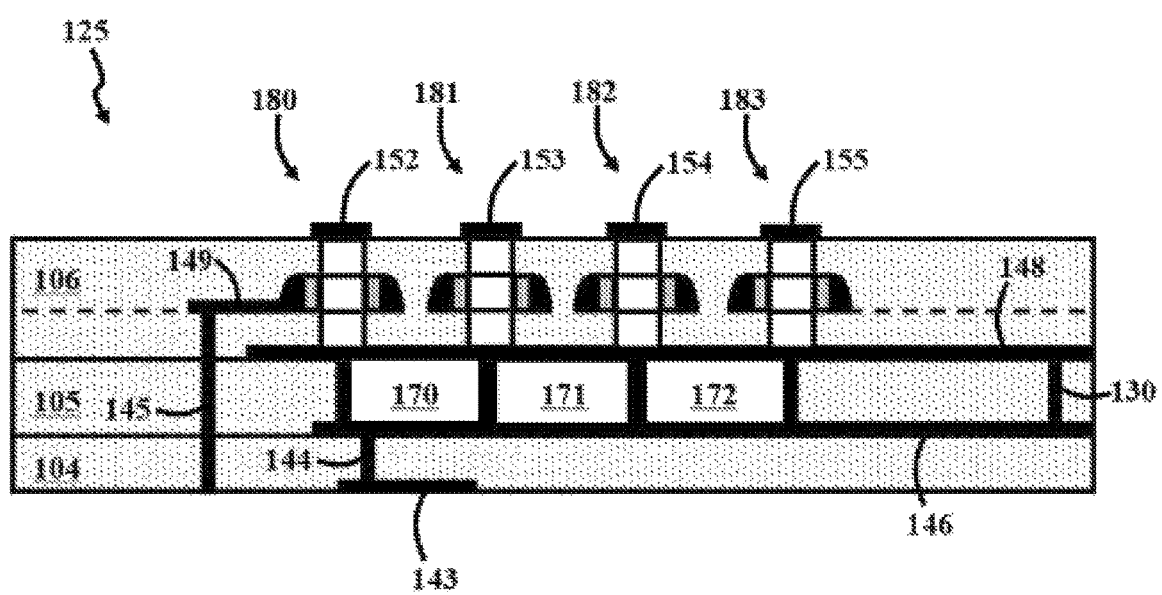
FIG. 12 is another embodiment of a portion of the bonded semiconductor structure 100 of FIG. 6, wherein five vias extend between the conductive bonding layer and the first interconnect, and a region extends between at least two of the vias.

FIG. 12 is another embodiment of the vertical device region 125. In this embodiment, the vertical device region 125 includes the bypass vias 147, 160, 161, 162, and 130, as shown in FIG. 10, wherein the bypass vias 147, 160, 161, 162, and 130 extend between the bypass interconnect 146 and conductive bonding layer 148, as discussed in more detail above.

The bypass via 147 is positioned proximate to the vertical transistor 180, and extends away therefrom towards the bypass interconnect 146. The bypass via 160 is positioned proximate to the vertical transistor 181, and extends away therefrom towards the bypass interconnect 146. The bypass via 161 is positioned proximate to the vertical transistor 182, and extends away therefrom towards the bypass interconnect 146. The bypass via 162 is positioned proximate to the vertical transistor 183, and extends away therefrom towards the bypass interconnect 146. The bypass via 130 is positioned away from the vertical transistors 180, 181, 182, and 183.

One end of the bypass via 147 is connected to the conductive bonding layer 148 and the opposed end is connected to the bypass interconnect 146. One end of the bypass via 160 is connected to the conductive bonding layer 148 and the opposed end is connected to the bypass interconnect 146. One end of the bypass via 161 is connected to the conductive bending layer 148 and the opposed end is connected to the bypass interconnect 146. One end of the bypass via 162 is connected to the conductive bonding layer 148 and the opposed end is connected to the bypass interconnect 146. One end of the bypass via 130 is connected to the conductive bonding layer 148 and the opposed end is connected to the bypass interconnect 146.

In this embodiment the portion shown in FIG. 12 includes a region 170, which extends between the vias 147 and 160 and between the bypass interconnect 146 and conductive bonding layer 148. The portion includes a region 171, which extends between the vias 160 and 161 and between the bypass interconnect 146 and conductive bonding layer 148. Further, the portion includes a region 372, which extends between the vias 161 and 162 and between the bypass interconnect 146 and conductive bonding layer 148.

The regions 170, 171, and 172 can include many different types of materials. In general, one or more of the materials of regions 170, 171, and 172 include a lower permittivity dielectric material than the dielectric materials of the dielectric region 105. In some embodiments, one or more of the materials of the regions 170, 171, and 172 include a lower permittivity dielectric material than the dielectric materials of the dielectric region 105. Further, in some embodiments, one or more of the materials of the regions 170, 171, and 172 include a lower permittivity dielectric material than the dielectric materials of the dielectric region 106. In some embodiments, one or more of the regions 170, 171, and 172 include air or another type of gas.

In general, the materials of the regions 170, 171, and 172 are chosen to reduce the capacitance between the bypass vias 147, 160, 161, and 162. In this way, the bypass vias 147, 160, 161, 162, and 130, the bypass interconnect 146, and the conductive bonding layer 148 are connected together to reduce the impedance thereof. Hence, the access time between various portions of the bonded semiconductor structure 100 is reduced. Further, the bonded semiconductor structure 100 can operate faster and it can process more data in a given amount of time. In this way, the bonded semiconductor structure 100 includes interconnects and vias which are connected together in a way to reduce the impedance thereof.

Figure 13:
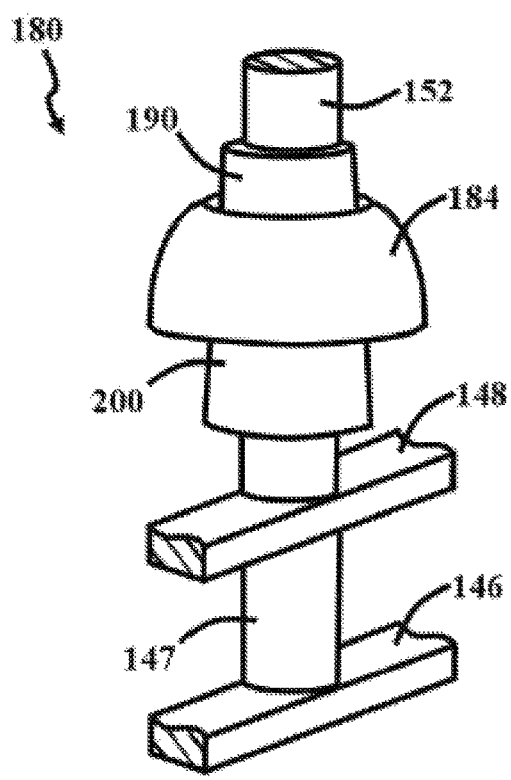
FIGS. 13 and 14 are perspective views of a first vertical transistor of FIG. 6.
Figure 14:
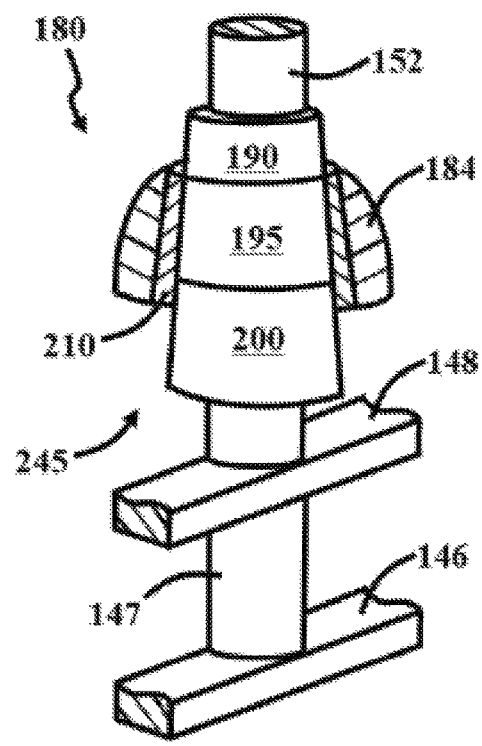

FIGS. 13 and 14 are perspective views of the vertical transistor 180 of FIG. 5. In this embodiment, the control dielectric 210 is formed around the mesa structure 245, and the control terminal 184 is formed around the control dielectric 210. The control dielectric 210 and control terminal 184 are positioned around the mesa structure 245 so that the conductivity of the semiconductor layer 195 can be controlled in response to a control signal applied to the control terminal 184. The control dielectric 210 is positioned adjacent to a sidewall of the mesa structure 245. The control dielectric 210 extends between the sidewall and control terminal 184. The interconnect 152 is connected to the semiconductor layer 190, and the conductive bonding layer 148 is connected to the semiconductor layer 200. It should be noted that the interconnect 152 can be connected directly to the semiconductor layer 190, or it can be connected to the semiconductor layer 190 through a conductive line, such as a via. Further, the conductive bonding layer 148 can be connected to the semiconductor layer 200 directly, or it can be connected to the semiconductor layer 200 through a conductive line, such as a via. In this embodiment the via 147 extends between the conductive bending layer 148 and bypass interconnect 146.

The control terminal 184 can include many different types of conductive materials. In some embodiments, control terminal 184 includes the same conductive materials as that included with the conductive lines of the bonded semiconductor structure 100. In other embodiments, control terminal 184 includes a different conductive material than that included with the conductive lines of the bonded semiconductor structure 100.

The control dielectric 210 can include many different dielectric materials. In some embodiments, the control dielectric 210 includes the same dielectric materials as that included with the other dielectric regions of the bonded semiconductor structure 100. In other embodiments, the control dielectric 210 includes a different dielectric material than that included with the dielectric material regions of the bonded semiconductor structure 100. In some embodiments, the control dielectric 210 includes a single layer of dielectric material and, in other embodiments, the control dielectric 210 includes a plurality of dielectric material layers. For example, in one embodiment, the control dielectric 210 include an oxide-nitride-oxide layer structure. One example of an oxide-nitride-oxide layer structure is a layer structure with silicon nitride positioned between opposed silicon oxide layers.

Figure 15:
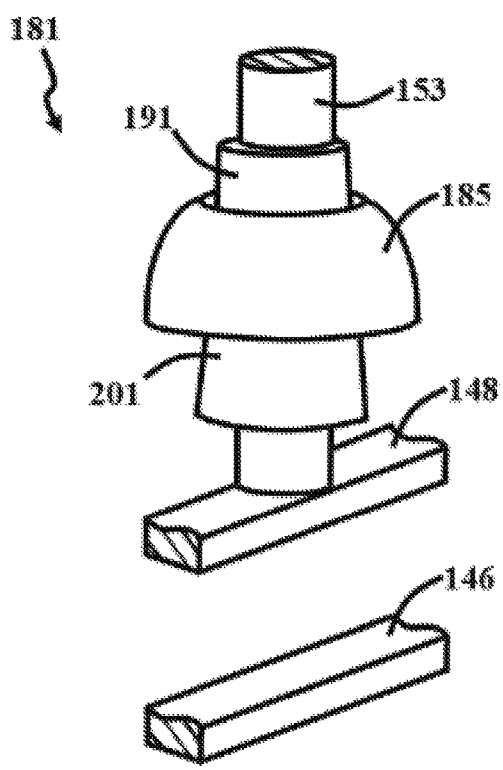
FIGS. 15 and 16 are perspective views of a second vertical transistor of FIG. 6.
Figure 16:
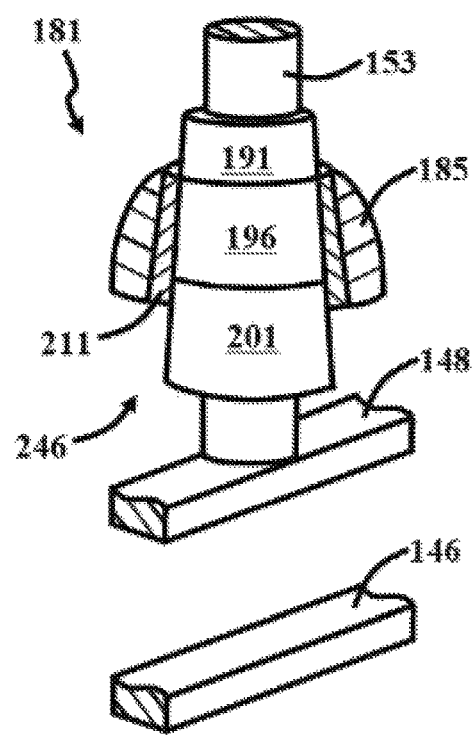

FIGS. 15 and 16 are perspective views of the vertical transistor 181 of FIG. 5. In this embodiment, the control dielectric 211 is formed around the mesa structure 246, and the control terminal 185 is formed around the control dielectric 211. The control dielectric 211 and control terminal 185 are positioned around the mesa structure 246 so that the conductivity of the semiconductor layer 196 can be controlled in response to a control signal applied to the control terminal 185. The control dielectric 211 is positioned adjacent to a sidewall of the mesa structure 246. The control dielectric 211 extends between the sidewall and control terminal 185. The interconnect 153 is connected to the semiconductor layer 191, and the conductive bonding layer 148 is connected to the semiconductor layer 201. It should be noted that the interconnect 153 can be connected directly to the semiconductor layer 191, or it can be connected to the semiconductor layer 191 through a conductive line, such as a via. Further, the conductive bonding layer 148 can be connected to the semiconductor layer 201 directly, or it can be connected to the semiconductor layer 201 through a conductive line, such as a via. In this embodiment, the conductive bonding layer 148 and bypass interconnect 146 are spaced apart from each other.

The control terminal 185 can include many different types of conductive materials. In some embodiments, control terminal 185 includes the same conductive materials as that included with the conductive lines of the bonded semiconductor structure 100. In other embodiments, control terminal 185 includes a different conductive material than that included with the conductive lines of the bonded semiconductor structure 100.

The control dielectric 211 can include many different dielectric materials. In some embodiments, the control dielectric 211 includes the same dielectric materials as that included with the other dielectric regions of the bonded semiconductor structure 100. In other embodiments, the control dielectric 211 includes a different dielectric material than that included with the dielectric material regions of the bonded semiconductor structure 100. In some embodiments, the control dielectric 211 includes a single layer of dielectric material and, in other embodiments, the control dielectric 211 includes a plurality of dielectric material layers. For example, in one embodiment, the control dielectric 211 include an oxide-nitride-oxide layer structure. One example of an oxide-nitride-oxide layer structure is a layer structure with silicon nitride positioned between opposed silicon oxide layers.

Figure 17:
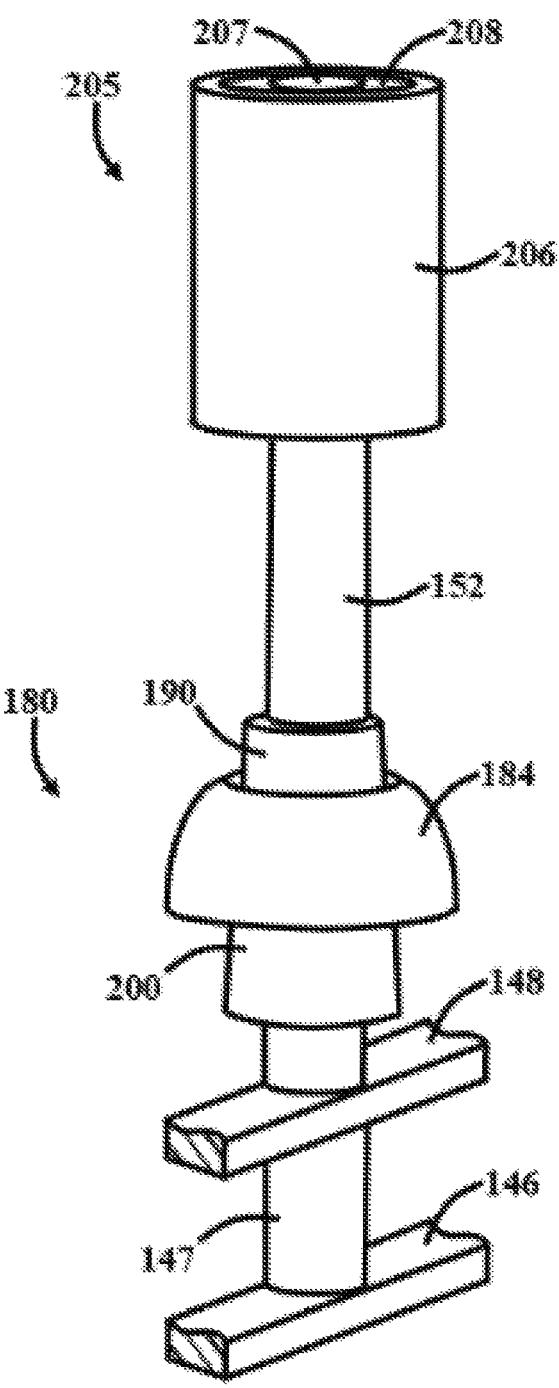
FIG. 17 is a perspective view of a dynamic random access memory cell, which can be included with the bonded semiconductor structure of FIG. 6.

FIG. 17 is a perspective view of a dynamic random access memory (DRAM) cell 204, which can be included with the bonded semiconductor structure 100 of FIG. 5. In this embodiment the DRAM cell 204 includes the vertical transistor 180 as shown in FIGS. 5, 13, and 14 above.

In this embodiment, the interconnect 152 is connected to the semiconductor layer 190, and the conductive bonding layer 148 is connected to the semiconductor layer 200. It should be noted that the interconnect 152 can be connected directly to the semiconductor layer 190, or it can be connected to the semiconductor layer 190 through a conductive line, such as a via. Further, the conductive bonding layer 148 can be connected to the semiconductor layer 200 directly, or it can be connected to the semiconductor layer 200 through a conductive line, such as a via. In this embodiment, the bypass via 147 extends between the conductive bonding layer 148 and bypass interconnect 146.

In this embodiment the DRAM cell 204 includes a storage capacitor 205 connected to the vertical transistor 180. The storage capacitor 205 can be of many different types of capacitors. In this embodiment, the storage capacitor 205 includes capacitors electrodes 206 and 207 spaced apart from each other by a capacitor electrode 208. The capacitor electrode 207 is connected to the interconnect 152. In this way, the bonded semiconductor structure 100 of FIG. 1 can include the storage capacitor 205 operatively connected to the vertical transistor 180, wherein the vertical transistor 180 and capacitor 205 operate as a DRAM cell. It should be noted that the transistors 110, 115, and or 120 can drive the operation of the DRAM cell 204.

In some embodiments, the DRAM cell is included in a memory array of such DRAM cells so that the conductive bonding layer 148 and bypass interconnect 146 operate as a bitline of the memory array. The bitline of the memory array allows information to flow therethrough, wherein the information is stored as digital data. In these embodiments, the memory array generally includes a plurality of vertical transistors 180 and a plurality of storage capacitors 205 operatively coupled together.

Figure 18:
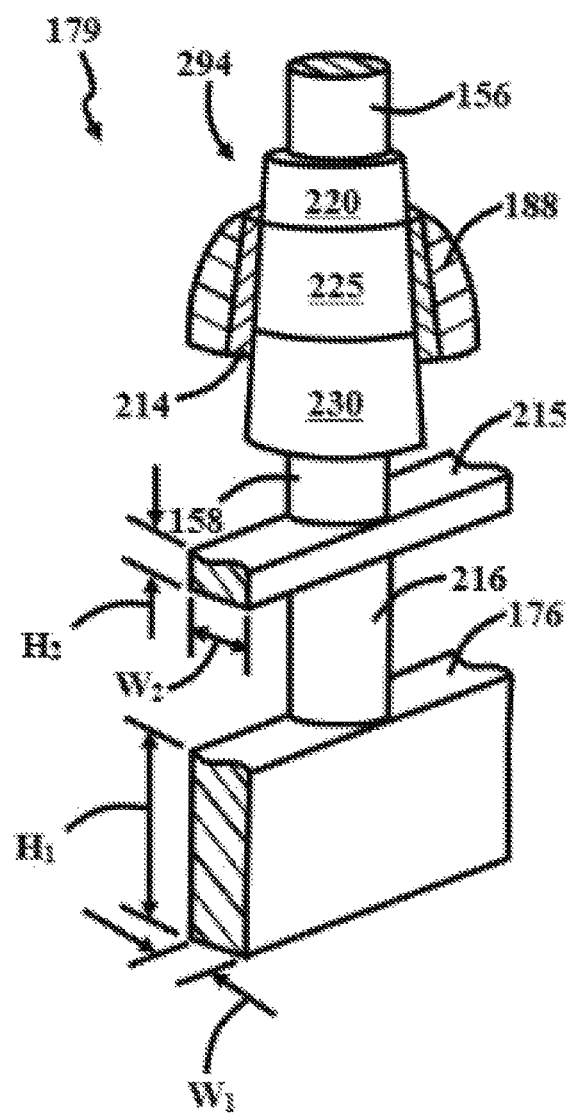
FIG. 18 is a perspective view of another embodiment of a vertical transistor.

FIG. 18 is a perspective view of another embodiment of a vertical transistor 179. It should be noted that the vertical transistor 179 and corresponding conductive lines can be included in the embodiments disclosed herein, such as the bonded semiconductor structures disclosed herein. The materials of the vertical transistor 179 can be the same materials mentioned above.

In this embodiment, the vertical transistor 179 includes a bypass interconnect 176, which can correspond to the bypass interconnect 146 of FIG. 6. The bypass interconnect 176 has a height $H_1$ and a width $W_1$, wherein the height $H_1$ is greater than the width $W_1$. In some embodiments, the height $H_1$ and width $W_1$ are the same. The height $H_1$ can have many different values compared to the width $W_1$. In one embodiment, the height $H_1$ is twice as much as the width $W_1$. In another embodiment, the height $H_1$ is three times as much as the width $W_1$. In some embodiments, the height $H_1$ is five times the width $W_1$. In general the height $H_1$ and width $W_1$ values are chosen to provide the bypass interconnect 176 with a desired impedance value.

In this embodiment, the vertical transistor 179 includes a via 216 which is connected to the bypass interconnect 176. The vertical transistor 179 includes a conductive bonding layer 215 which is connected to the via 216. Hence, the via 216 connects the bypass interconnect 176 and conductive bonding layer 215 together. The conductive bonding layer 215 includes a height $H_2$ and a width $W_2$, wherein the height $H_2$ and width $W_2$ are substantially the same. In some embodiments, the height $H_2$ is between about one have to three quarters the value of the width $W_2$. In other embodiments, the width $W_2$ is between about one have to three quarters the value of the height $H_2$. In this embodiment, the height $H_2$ is less than the height $H_1$ and the widths $W_1$ and $W_2$ are substantially the same. In other embodiments, the widths $W_1$ and $W_2$ can be different. In this embodiment, the vertical transistor 179 includes a via 158 connected to the conductive bonding layer 215. It should be noted that the via 158 can be formed from the conductive bonding layer 215, if desired.

In this embodiment, the vertical transistor 179 includes a semiconductor layer 230 connected to the via 158. It should be noted that, in some embodiments, the semiconductor layer 230 can be bonded directly to the conductive bonding layer 215. In this way, the via 158 is optional. The vertical transistor 179 includes a semiconductor layer 225 positioned on the semiconductor layer 230, and a semiconductor layer 220 positioned on the semiconductor layer 225. The semiconductor layers 220, 225, and 230 form a mesa structure 249.

In this embodiment the vertical transistor 179 includes a control dielectric 214 which is formed around the mesa structure 294. A control terminal 188 is formed around the control dielectric 214. The control dielectric 214 and control terminal 188 are positioned around the mesa structure 294 so that the conductivity of the semiconductor layer 225 can be controlled in response to a control signal applied to the control terminal 188. The control dielectric 214 is positioned adjacent to a sidewall of the mesa structure 294. The control dielectric 214 extends between the sidewall and control terminal 188. A bypass interconnect 156 is connected to the semiconductor laser 220. It should be noted that the bypass interconnect 156 can be connected directly to the semiconductor layer 220, or it can be connected to the semiconductor layer 220 through a conductive line, such as a via.

Figure 19:
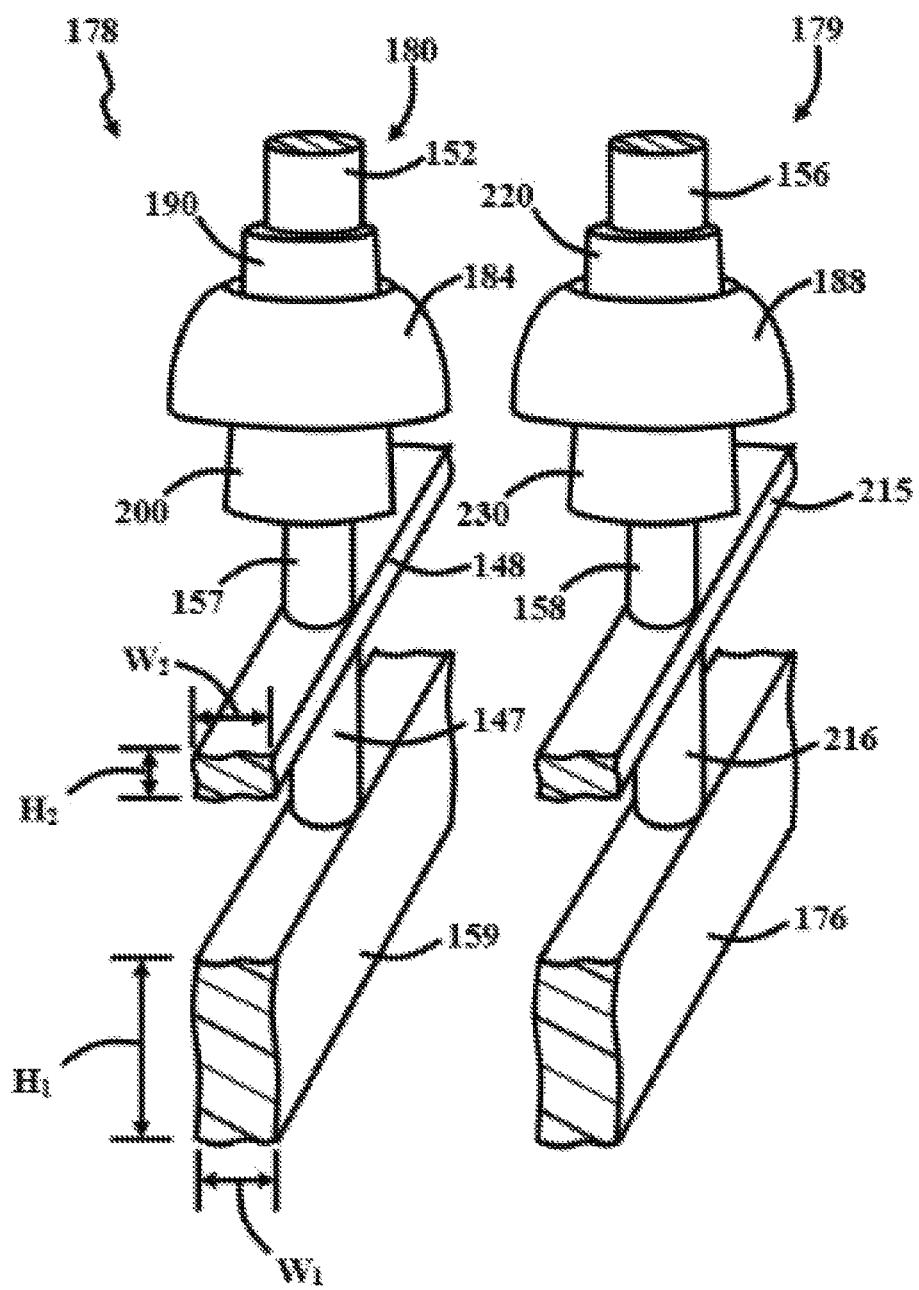
FIG. 19 is a perspective view of one embodiment of a memory array.

FIG. 19 is a perspective view of one embodiment of a memory array 178. It should be noted that the memory array 178 can include the vertical transistors disclosed herein. Further, the memory array 178 can be included with the bonded semiconductor structures disclosed herein. It should also be noted that the corresponding conductive lines of the memory array 178 can be included in the embodiments disclosed herein, such as bonded semiconductor structure 100. The materials of the memory array 178 can be the same materials mentioned above.

In this embodiment, the memory array 178 includes the vertical transistors 179 and 180, which are spaced apart from each other. The vertical transistor 180 is described in more detail above in FIG. 13 and the vertical transistor 179 is described in more detail above in FIG. 18.

In this embodiment, the vertical transistor 180 includes a bypass interconnect 159, which can correspond to the bypass interconnect 146 of FIG. 6. The bypass interconnect 159 has the height $H_1$ and the width $W_1$, wherein the height $H_1$ is greater than the width $W_1$. In some embodiments, and as mentioned above, the height $H_1$ and width $W_1$ are the same. The height $H_1$ can have many different values compared to the width $W_1$. In one embodiment, the height $H_1$ is twice as much as the width $W_1$. In another embodiment, the height $H_1$ is three times as much as the width $W_1$. In some embodiments, the height $H_1$ is five times the width $W_1$. In general, the height $H_1$ and width $W_1$ values are chosen to provide the bypass interconnect 159 with a desired impedance value.

In this embodiment, the vertical transistor 180 includes the bypass via 147 which is connected to the bypass interconnect 159. The vertical transistor 180 includes the conductive bonding layer 148 which is connected to the bypass via 147. Hence, the bypass via 147 connects the bypass interconnect 159 and conductive bonding layer 148 together. The conductive bonding layer 148 includes the height $H_2$ and the width $W_2$, wherein the height $H_2$ and width $W_2$ are substantially the same. In some embodiments, the height $H_2$ is between about one have to three quarters the value of the width $W_2$. In other embodiments, the width $W_2$ is between about one have to three quarters the value of the height $H_2$. In this embodiment, the height $H_2$ is less than the height $H_1$ and the widths $W_1$ and $W_2$ are substantially the same. In other embodiments, the widths $W_1$ and $W_2$ can be different. In this embodiment, the vertical transistor 180 includes a via 157 which is connected to the conductive bonding layer 148. It should be noted that the via 157 can be formed from the conductive bending layer 148, if desired.

In this embodiment, the vertical transistor 180 includes the semiconductor layer 200 which is connected to the via 157. It should be noted that in some embodiments, the semiconductor layer 200 can be bonded directly to the conductive bonding layer 148. In this way, the via 157 is optional. The vertical transistor 180 includes the semiconductor layer 195 positioned on the semiconductor layer 200, and the semiconductor layer 190 positioned on the semiconductor layer 195, as shown in FIG. 14. The semiconductor layers 190, 195, and 200 form the mesa structure 160.

In this embodiment, the vertical transistor 180 includes the control dielectric 210 which is formed around the mesa structure 160. The control terminal 184 is formed around the control dielectric 210, as shown in FIG. 14. The control dielectric 210 and control terminal 184 are positioned around the mesa structure 160 so that the conductivity of the semiconductor layer 195 can be controlled in response to a control signal applied to the control terminal 184. The control dielectric 210 is positioned adjacent to a sidewall of the mesa structure 160. The control dielectric 210 extends between the sidewall and control terminal 184. The interconnect 152 is connected to the semiconductor layer 190. It should be noted that the interconnect 152 can be connected directly to the semiconductor layer 190, or it can be connected to the semiconductor layer 190 through a conductive line, such as a via.

In some embodiments, a dielectric material is positioned between the bypass interconnects 159 and 176. In other embodiments, a region that includes a lower permittivity dielectric material is positioned between the bypass interconnects 159 and 176, as will be discussed in more detail presently.

Figure 20:
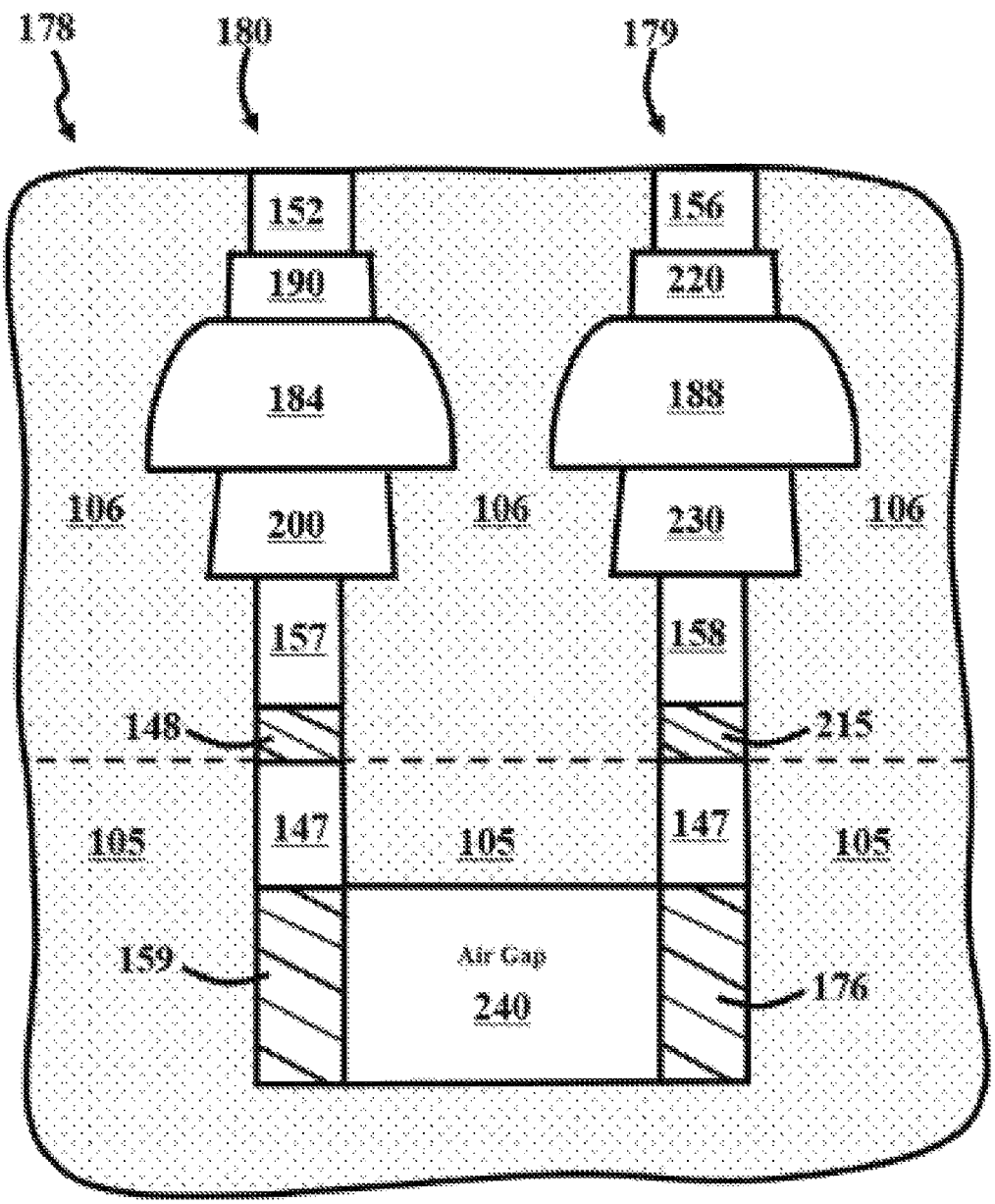
FIG. 20 is a side view of the memory array of FIG. 19.

FIG. 20 is a cut-away side view of the memory array 178 of FIG. 19. In this embodiment, the memory array 178 includes the vertical transistors 179 and 180, as shown in FIG. 19, wherein the vertical transistors 179 and 180 extend through the dielectric regions 105 and 106. In this embodiment, the memory array 178 includes a region 240. The region 240 can be positioned at many different locations. In this embodiment, the region 240 is positioned so it extends between the bypass interconnects 159 and 176. The region 240 extends through the dielectric region 105. The region 240 can be formed in many different ways, such as by using a mask and etching therethrough the dielectric region 105.

The region 240 can include many different types of materials. In general, the region 240 includes a lower permittivity dielectric material than the dielectric materials of the dielectric region 105. In some embodiments, the region 240 includes a lower permittivity dielectric material than the dielectric materials of the dielectric region 105. Further, in some embodiments, the region 240 includes a lower permittivity dielectric material than the dielectric materials of the dielectric region 106. In some embodiments, the region 240 includes air or another type of gas.

The region 240 increases the impedance between the bypass interconnects 159 and 176 so that there is less cross-talk therebetween. The impedance can be in the form of a parasitic impedance, such as a parasitic resistance, capacitance, and or inductance. The parasitic impedance can be a bitline-to-bitline capacitance, a bitline-to-bitline inductance, or a bitline-to-bitline resistance, for example, or a combination thereof. The high impedance is generally undesirable because it slows the operation of the 3D-IC. The operation of the 3D-IC slows down in response to basing a high impedance because it takes longer for signals to travel therethrough.

Figure 21:
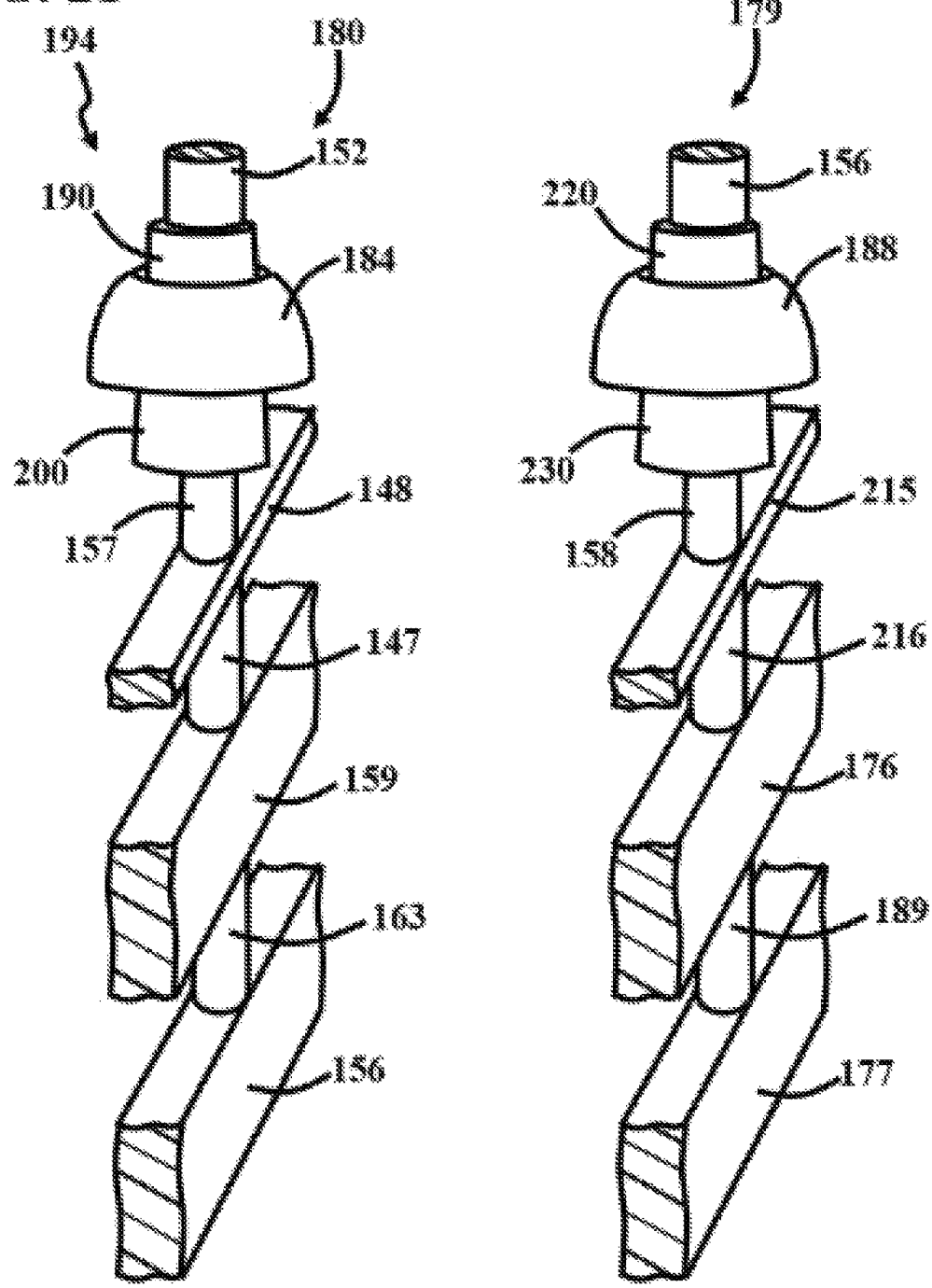
FIG. 21 is a perspective view of another embodiment of a memory array.

FIG. 21 is a perspective view of one embodiment of a memory array 194. It should be noted that the memory array 194 can include the vertical transistors disclosed herein. Further, the memory array 194 can be included with the bonded semiconductor structures disclosed herein. It should also be noted that the corresponding conduct be lines of the memory array 104 can be included in the embodiments disclosed herein, such as bended semiconductor structure 100. The materials of the memory array 194 can be the same materials mentioned above.

In this embodiment, the memory array 194 includes the vertical transistors 179 and 180, which are spaced apart from each other. The vertical transistor 180 is described in more detail above in FIGS. 13 and 14 and the vertical transistor 179 is described in more detail above in FIG. 18. The memory array 194 includes the memory array 178 of FIG. 19.

In this embodiment, the memory array 194 includes the bypass interconnect 156, which is shown in FIG. 11. The height and width of the bypass interconnect 156 is chosen to provide it with a desired impedance value. The bypass interconnect 156 is connected to the bypass interconnect 159 through the via 163. It should be noted that they bypass interconnect 159 of FIG. 21 corresponds to the bypass interconnect 146 of FIG. 11.

In this embodiment the memory array 194 includes a bypass interconnect 177. The height and width of the bypass interconnect 177 is chosen to provide it with a desired impedance value. The bypass interconnect 177 is connected to the bypass interconnect 176 through a bypass via 189.

In some embodiments, a dielectric material is positioned between the bypass interconnects 156 and 177. In other embodiments, a region that includes a fewer permittivity dielectric material is positioned between the bypass interconnects 156 and 177, as will be discussed in more detail presently.

Figure 22:
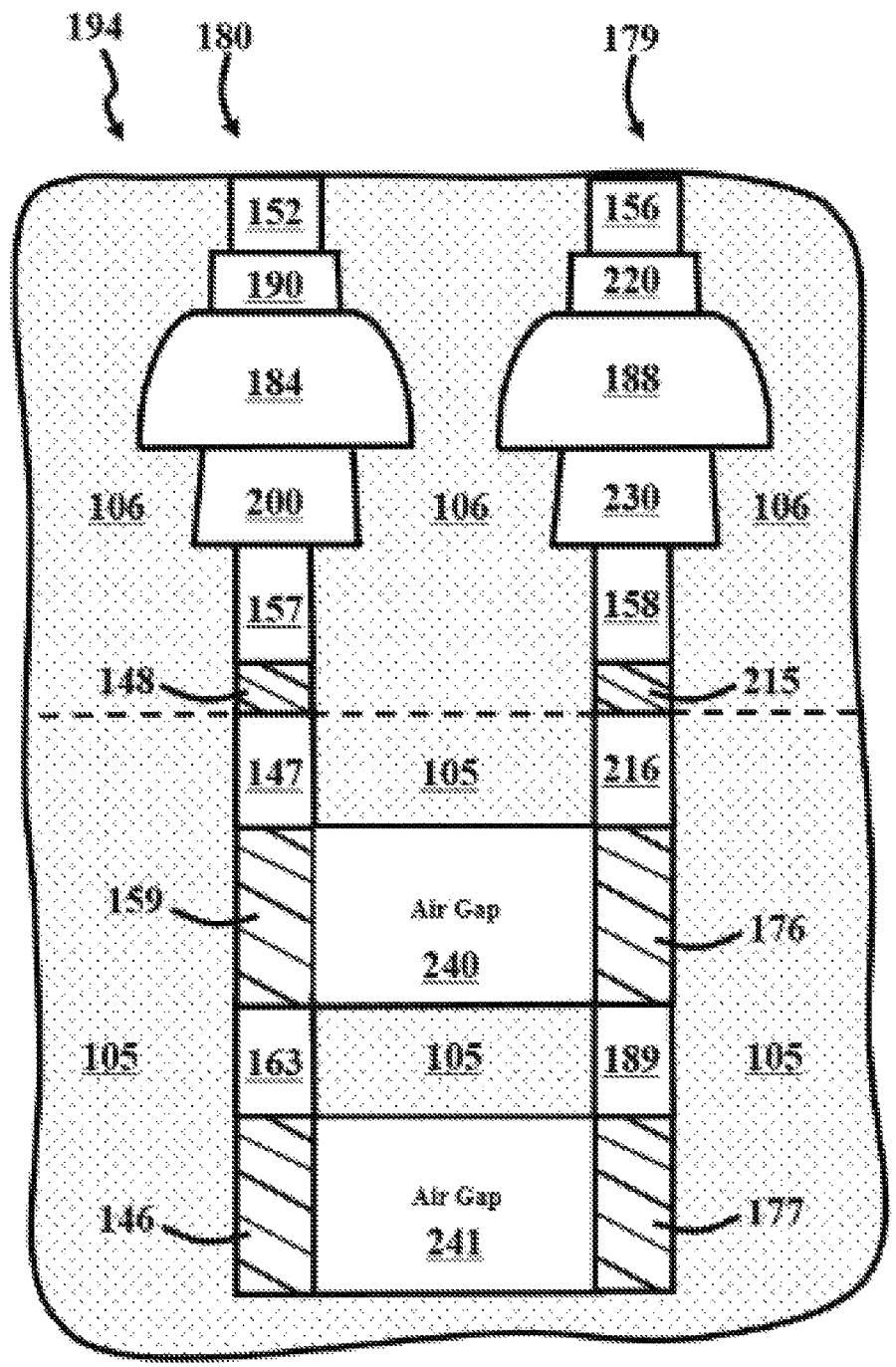
FIG. 22 is a side view of the memory array of FIG. 21.

FIG. 22 is a cut-away side view of the memory array 194 of FIG. 21. In this embodiment, the memory array 194 includes the vertical transistors 179 and 180, as shown in FIG. 21, wherein the vertical transistors 179 and 180 extend through the dielectric regions 105 and 106. In this embodiment, the memory array 194 includes the region 240. The region 240 can be positioned at many different locations. In this embodiment, the region 240 is positioned so it extends between the bypass interconnects 159 and 176. The region 240 extends through the dielectric region 105. The region 240 can be formed in many different ways, such as by using a mask and etching therethrough the dielectric region 105. The region 240 is discussed in more detail above with FIG. 20.

In this embodiment, the memory array 194 includes a region 241. The region 241 can be positioned at many different locations. In this embodiment, the region 241 is positioned so it extends between the bypass interconnects 156 and 177. The region 241 extends through the dielectric region 105. The region 241 can be formed in many different ways, such as by using a mask and etching therethrough the dielectric region 105.

The region 241 can include many different types of materials. In general the region 241 includes a lower permittivity dielectric material than the dielectric materials of the dielectric region 105. In some embodiments, the region 241 includes a lower permittivity dielectric material than the dielectric materials of the dielectric region 105. Further, in some embodiments, the region 241 includes a lower permittivity dielectric material than the dielectric materials of the dielectric region 106. In some embodiments, the region 241 includes air or another type of gas. It should be noted that the regions 240 and 241 can be the same or they can be different. For example, the region 240 can include an air gap and the region 241 can include a low permittivity material.

The region 241 increases the impedance between the bypass interconnects 156 and 177 so that there is less cross-talk therebetween. Further, the region 241 increases the impedance between the bypass interconnects 156 and 177. The impedance can be in the form of a parasitic impedance, such as a parasitic resistance, capacitance, and/or inductance. The parasitic, impedance can be a bitline-to-bitline capacitance, a bitline-to-bitline inductance, or a bitline-to-bitline resistance, for example, or a combination thereof. The high impedance is generally undesirable because it slows the operation of the 3D-IC. The operation of the 3D-IC slows down in response to having a high impedance because it takes longer for signals to travel therethrough.

FIG. 23 is a top view of an embodiment of a layout 127, which include aligned bypass vias. In this embodiment, the layout 127 includes the conductive bonding layer 148 and the bypass vias 147, 160, and 161. The bypass vias 147, 160, and 161 are connected to the conductive bonding layer 148, as described above with FIG. 9, wherein the vias 147, 160, and 161 extend away from the conductive bonding layer 148 and connect to the bypass interconnect 146. In some embodiments, the vias 147, 160, and 161 can extend away from the conductive bending layer 148 to the bypass inter connect 159, as shown in FIG. 19.

In this embodiment, the layout 127 include the conductive bonding layer 215, as shown in FIGS. 18 and 19, and the bypass vias 216, 218, and 219. The bypass vias 216, 218, and 219 are connected to the conductive bonding layer 215, as described above, wherein the bypass vias 216, 218, and 219 extend away from the conductive bonding layer 215 and connect to the bypass interconnect 176 (FIG. 19).

In this embodiment, the bypass vias 147 and 216 are aligned with each other. Further, the bypass vias 160 and 218 are aligned with each other. Also, the bypass vias 161 and 219 are aligned with each other. In this way, the vias of the layout 127 are aligned. It should be noted that, in some embodiments, a dielectric material extends between the conductive lines 148 and 215 and, in other embodiments, an air gap extends between the conductive lines 148 and 215. In some embodiments, a dielectric material extends between the bypass vias 147 and 216 and, in other embodiments, an air gap extends between the bypass vias 147 and 216. Further, in some embodiments, a dielectric material extends between the bypass vias 160 and 217 and, in other embodiments, an air gap extends between the bypass vias 160 and 217. Also, in some embodiments, a dielectric material extends between the bypass vias 161 and 219 and, in other embodiments, an air gap extends between the bypass vias 161 and 219. Examples of air gaps and low dielectric material regions are discussed in more detail above.

FIG. 24 is a top view of an embodiment of a layout 128, which include staggered bypass vias. In tins embodiment, the layout 128 include the conductive bonding layer 148 and the bypass vias 147, 160, and 161. The bypass vias 147, 160, and 161 are connected to the conductive bonding layer 148, as described above with FIG. 9, wherein the bypass vias 147, 160, and 161 extend away from the conductive bonding layer 148 and connect to the bypass interconnect 146. In some embodiments, the bypass vias 147, 160, and 161 can extend away from the conductive bonding layer 148 to the bypass interconnect 159, as shown in FIG. 19.

In this embodiment, the layout 128 include the conductive bonding layer 215, as shown in FIGS. 18 and 19, and the bypass vias 216 and 219. The bypass vias 216 and 219 are connected to the conductive bonding layer 215, as described above, wherein the bypass vias 216 and 219 extend away from the conductive bonding layer 215 and connect to the bypass interconnect 176 (FIG. 19).

In this embodiment, the bypass vias 147 and 216 are not aligned with each other and the bypass vias 160 and 216 are not aligned with each other. Further, the bypass vias 160 and 219 are not aligned with each other and the bypass vias 161 and 219 are not aligned with each other. In this way, the vias of the layout 128 are not aligned. The bypass vias of the layout 128 are staggered with each other. It should be noted that, in some embodiments, a dielectric material extends between the conductive lines 148 and 215 and, in other embodiments, an air gap extends between the conductive lines 148 and 215. In some embodiments, a dielectric material extends between the bypass vias 147 and 216 and, in other embodiments, an air gap extends between the bypass vias 147 and 216. Further, in some embodiments, a dielectric material extends between the vias 160 and 216 and, in other embodiments, an air gap extends between the bypass vias 160 and 216. Also, in some embodiments, a dielectric material extends between the bypass vias 160 and 219 and, in other embodiments, an air gap extends between the bypass vias 160 and 219. In some embodiments, a dielectric material extends between the bypass vias 161 and 219 and, in other embodiments, an air gap extends between the bypass vias 161 and 219. Examples, of air gaps are discussed above with FIG. 12.

A bonded semiconductor structure is disclosed which includes interconnects and vias which are connected together in a way to reduce the impedance thereof. In this way, the access time between various portions of the bonded semiconductor structure is reduced. Hence, the bonded semiconductor structure can operate faster and it can process more data in a given amount of time.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

The invention claimed is:

1. A method of manufacturing a bonded semiconductor structure, comprising:
   providing a support substrate which carries a transistor;
   providing an interconnect region carried by the support substrate, wherein the interconnect region includes a first multiple bypass bitline having an upper bypass interconnect and upper bypass via;
   providing a first conductive bonding layer carried by the interconnect region, wherein the first conductive bonding layer is connected to the upper bypass interconnect through the upper bypass via;
   providing a vertical transistor carried by the first conductive bonding layer, the vertical transistor being in communication with the transistor through the interconnect region; and
   providing a second multiple bypass bitline having an upper bypass interconnect and lower bypass via, and a second conductive bonding layer connected to the upper bypass interconnect of the second multiple bypass bitline through the lower bypass via of the second multiple bypass bitline;
   wherein an air gap extends between the bypass interconnects of the first and second multiple bypass bitlines.

2. The method of claim 1, wherein the first multiple bypass bitline includes a lower bypass interconnect and lower bypass via, wherein the upper and lower bypass interconnects of the first multiple bypass bitline are connected through the lower bypass via.

3. The method of claim 2, further including choosing the material of the upper and lower bypass interconnects and first conductive bonding layer so that the impedance of the upper and lower bypass interconnects is less than the impedance of the first conductive bonding layer.

4. The method of claim 2, further including providing the upper and lower bypass interconnects of the first multiple bypass bitline and first conductive bonding layer so they are electrically connected in parallel to each other.

5. The method of claim 1, wherein the vias of the first and second multiple bypass bitlines are staggered.

6. The method of claim 1, wherein the first multiple bypass bitline includes tungsten.

7. The method of claim 1, wherein the vertical transistor is included with a memory array, and the first multiple bypass bitline operates as a bitline of the memory array.

8. The method of claim 1, further including forming a storage capacitor operatively connected to the vertical transistor, wherein the vertical transistor and storage capacitor operate as a DRAM cell.

9. A method of manufacturing a bonded semiconductor structure, comprising:
   providing a support substrate which carries circuitry;
   providing a first multiple bypass bitline which includes a first upper bypass interconnect and a first plurality of upper bypass vias,
   providing a first conductive bonding layer, wherein the first conductive bonding layer is connected to the first upper bypass interconnect through the first plurality of upper bypass vias;
   providing a first plurality of vertical transistors carried by the first conductive bonding layer, the first plurality of vertical transistors being in communication with the circuitry, wherein the circuitry provides memory operation;
   wherein the first plurality of upper bypass vias electrically connect the first conductive bonding layer and the first upper bypass interconnect in parallel with each other; and
   providing a second multiple bypass bitline which includes a second upper bypass interconnect and a second plurality of upper bypass vias;
   wherein an air gap extends between the first and second multiple bypass bitlines.

10. The method of claim 9, further including choosing the material of the first upper bypass interconnect and first conductive bonding layer so that the impedance of the first upper bypass interconnect is less than the impedance of the first conductive bonding layer.

11. The method of claim 9, wherein the first and second multiple bypass bitlines each include a lower bypass interconnect and a plurality of lower bypass vias.

12. The method of claim 9, further including providing the first and second plurality of upper bypass vias of the first and second multiple bypass bitlines so they are staggered.

13. The method of claim 11, further including providing the lower plurality of bypass vias of the first and second multiple bypass bitlines so they are staggered.

14. The method of claim 9, wherein the first bypass interconnect includes tungsten.

15. The method of claim 9, further including forming a plurality of storage capacitors operatively connected to corresponding vertical transistors, wherein the vertical transistors and storage capacitors operate as a DRAM memory array.

16. The method of claim 9, wherein the first conductive bonding layer and upper bypass interconnect operate as a bitline of a memory array.

17. A method of forming a bonded semiconductor structure, comprising:
   providing a support substrate which carries circuitry;
   providing a first and second multiple bypass bitlines which each include upper and lower bypass interconnects;
   providing first and second conductive bonding layers connected to the first and second multiple bypass interconnects, respectively; and
   providing first and second vertical transistors carried by the first and second conductive bonding layers, respectively, the first and second vertical transistors being controlled by the circuitry;
   wherein the upper bypass interconnects of the first and second multiple bypass bitlines are spaced apart from each other by an upper air gap.

18. The method of claim 17, wherein the lower bypass interconnects of the first and second multiple bypass bitlines are spaced apart from each other by a lower air gap.

19. The method of claim 18, wherein the first multiple bypass bitline includes a plurality of upper bypass vias which electrically connect in parallel the first conductive bonding layer and upper bypass interconnect of the first multiple bypass bitline.

20. The method of claim 19, wherein the second multiple bypass bitline includes a plurality of upper bypass vias which electrically connect in parallel the second conductive bonding layer and upper bypass interconnect of the second multiple bypass bitline.

21. The method of claim 20, wherein the plurality of upper bypass vias of the first and second multiple bypass bitlines are staggered.

22. The method of claim 17, wherein the first multiple bypass bitlines includes tungsten.

23. The method of claim 17, further including forming first and second storage capacitors operatively connected to the first and second vertical transistors, respectively, wherein the first and second vertical transistors and first and second storage capacitors operate as a DRAM memory array.

24. The method of claim 17, wherein the first and second multiple bypass bitlines operate as a bitline of a memory array.

* * * * *